(12) United States Patent
Baik et al.

(10) Patent No.: US 7,665,001 B2
(45) Date of Patent: Feb. 16, 2010

(54) PROGRESSIVE RANDOM ACCESS SCAN CIRCUITRY

(75) Inventors: Dong Hyun Baik, Hillsboro, OR (US); Kewal K. Saluja, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 307 days.

(21) Appl. No.: 11/526,379

(22) Filed: Sep. 25, 2006

(65) Prior Publication Data

US 2008/0091995 A1 Apr. 17, 2008

(51) Int. Cl.
*G01R 31/28* (2006.01)

(52) U.S. Cl. ..................................... 714/726

(58) Field of Classification Search ................ 714/726; 327/202
See application file for complete search history.

(56) References Cited

U.S. PATENT DOCUMENTS

| | | | |
|---|---|---|---|
| 5,748,643 A * | 5/1998 | Pelella et al. ................ | 714/726 |
| 6,389,566 B1 * | 5/2002 | Wagner et al. ............... | 714/726 |
| 6,785,855 B2 * | 8/2004 | Zhang et al. ................ | 714/731 |
| 7,437,634 B2 * | 10/2008 | Jaber et al. .................. | 714/726 |

OTHER PUBLICATIONS

Janusz Rajski et al., "Embedded Deterministic Test," IEEE Transactions On Computer-Aided Design of Integrated Circuits and Systems; May 2004; pp. 776-792; vol. 23, No. 5.

Hisashige Ando, "Testing VLSI With Random Access Scan," comp con 80, Twentieth IEEE Computer Society International Conference; Feb. 1980; pp. i, ii, 50-52.

Michael L. Bushnell et al., "Essentials of Electronic Testing For Digital, Memory and Mixed-Signal VLSI Circuits," Kluwer Academic Publishers; 2000; pp. Title p. 2, Table of Contents (8).

Dong Hyun Baik, et al., "Random Access Scan: A solution to test power, test data volume and test time," 17th International Conference on VLSI Design; 2004; (6 pages).

(Continued)

*Primary Examiner*—James C Kerveros
(74) *Attorney, Agent, or Firm*—Brinks Hofer Gilson & Lione

(57) ABSTRACT

A scan cell is described for testing an integrated circuit. The scan cell may include circuitry adapted to operate in a non-test mode as a storage element and adapted to operate as a static random access memory (SRAM) cell in a test mode. For example, the circuitry may include one or more pass transistors and a flip flop. The scan cell may be one of a plurality of addressable scan cells in one or more grids for testing the integrated circuit. For example, the scan cells may be arranged in a single grid or may be partitioned into two or more grids. The scan cell may be used for reliability testing or for performance testing. The PRAS cell for performance testing may be staged, with a first pattern applied and then a second pattern applied. For example, one section of the scan cell may operate using a clock cycle of $\Phi_1$ and another section of the PRAS cell may operate using a clock cycle of $\Phi_2$ which is different from $\Phi_1$.

19 Claims, 24 Drawing Sheets

OTHER PUBLICATIONS

Seiji Kajihara et al., "Cost-Effective Generation of Minimal Test Sets for Stuck-at Faults in Combinational Logic Circuits," IEEE Transactions on Computer-Aided Design of Integrated Circuits and Systems; Dec. 1995; pp. 1496-1504; vol. 14, No. 12.

Sung-Mo (Steve) Kang et al., "Gmos Digital Integrated Circuits Analysis and Design, Second Edition," 1999; WCB McGraw-Hill; USA.

Kohei Miyase et al., "Don't-Care Identification on Specific Bits of Test Patterns*," IEEE International Conference on Computer Design: VLSI in Computers and Processors; 2002; (6 pages).

* cited by examiner (1) For each test pattern $t_i$, $(i = 1 \ldots N)$
  Enable $TestMode$;
(2) For each row $r_j$, $(j = 1 \ldots m)$
  Read row $r_j$/update MISR;
  For each conflicting columns in $r_j$
    Update scan-cell;
  Progress to the next row;
(3) Disable $TestMode$;
(4) Toggle normal clock (test response capture);
  Scan out MISR;

*Fig. 5*

| Circuit and vector statistics | Configuration MSS (l × c) | Configuration PGPRAS (m × n) | Test app. time MSS (# cycle) | Test app. time PGPRAS (# cycle) | Speed Up (×) | Test pin count MSS (#) | Test pin count PGPRAS (#) | Test pin count Eq.MSS (#) |
|---|---|---|---|---|---|---|---|---|
| s13207 | | | | | | | | |
| $n_{ff}=669$ | 335 × 2 | 126 × 6 | 78960 | 34914 | 2.26 | 4 | 4 | 10 |
| $N=235$ | 223 × 3 | 52 × 13 | 52640 | 17524 | 3.00 | 6 | 5 | 18 |
| $F=7.9\%$ | 223 × 3 | 26 × 26 | 52640 | 11414 | 4.61 | 6 | 6 | 28 |
| $n_{tp}=5043$ | 168 × 4 | 13 × 52 | 39715 | 8359 | 4.75 | 8 | 7 | 40 |
|  | 168 × 4 | 6 × 126 | 39715 | 6714 | 5.92 | 8 | 8 | 48 |
| s15850 | | | | | | | | |
| $n_{ff}=597$ | 299 × 2 | 96 × 7 | 29100 | 14315 | 2.03 | 4 | 4 | 8 |
| $N=97$ | 199 × 3 | 48 × 13 | 19400 | 9659 | 2.01 | 6 | 5 | 12 |
| $F=22.8\%$ | 199 × 3 | 24 × 25 | 19400 | 7331 | 2.65 | 6 | 6 | 16 |
| $n_{tp}=4881$ | 150 × 4 | 12 × 50 | 14647 | 6167 | 2.38 | 8 | 7 | 20 |
|  | 150 × 4 | 6 × 100 | 14647 | 5585 | 2.62 | 8 | 8 | 22 |
| s35932 | | | | | | | | |
| $n_{ff}=1728$ | 576 × 3 | 168 × 11 | 43852 | 19200 | 2.28 | 6 | 5 | 14 |
| $N=76$ | 576 × 3 | 84 × 21 | 43852 | 12816 | 3.42 | 6 | 6 | 20 |
| $F=11.7\%$ | 432 × 4 | 42 × 42 | 32908 | 9624 | 3.42 | 8 | 7 | 28 |
| $n_{tp}=6314$ | 432 × 4 | 21 × 84 | 32908 | 8028 | 4.10 | 8 | 8 | 34 |
|  | 346 × 5 | 11 × 168 | 26372 | 7268 | 3.63 | 10 | 9 | 36 |
| s38417 | | | | | | | | |
| $n_{ff}=1636$ | 546 × 3 | 160 × 11 | 47589 | 29251 | 1.63 | 6 | 5 | 10 |
| $N=87$ | 546 × 3 | 80 × 21 | 47589 | 22291 | 2.13 | 6 | 6 | 12 |
| $F=25.3\%$ | 409 × 4 | 40 × 41 | 35670 | 18811 | 1.90 | 8 | 7 | 16 |
| $n_{tp}=16203$ | 409 × 4 | 20 × 82 | 35670 | 17071 | 2.09 | 8 | 8 | 16 |
|  | 328 × 5 | 10 × 164 | 28623 | 16201 | 1.77 | 10 | 9 | 18 |
| s38584 | | | | | | | | |
| $n_{ff}=1452$ | 484 × 3 | 152 × 10 | 55290 | 31421 | 1.76 | 6 | 5 | 10 |
| $N=114$ | 484 × 3 | 76 × 20 | 55290 | 22757 | 2.43 | 6 | 6 | 14 |
| $F=18.9\%$ | 363 × 4 | 38 × 39 | 41496 | 18425 | 2.25 | 8 | 7 | 19 |
| $n_{tp}=13940$ | 363 × 4 | 19 × 78 | 41496 | 16259 | 2.55 | 8 | 8 | 20 |
|  | 291 × 5 | 10 × 156 | 33288 | 15233 | 2.19 | 10 | 9 | 22 |
| b17s | | | | | | | | |
| $n_{ff}=1415$ | 472 × 3 | 152 × 10 | 291841 | 118906 | 2.45 | 6 | 5 | 14 |
| $N=617$ | 472 × 3 | 76 × 19 | 291841 | 72014 | 4.05 | 6 | 6 | 24 |
| $F=18.9\%$ | 354 × 4 | 38 × 38 | 219035 | 48568 | 4.51 | 8 | 7 | 36 |
| $n_{tp}=24467$ | 354 × 4 | 19 × 76 | 219035 | 36845 | 5.94 | 8 | 8 | 48 |
|  | 283 × 5 | 10 × 152 | 175228 | 31292 | 5.60 | 10 | 9 | 58 |
| b20s | | | | | | | | |
| $n_{ff}=490$ | 245 × 2 | 88 × 6 | 107748 | 55685 | 1.93 | 4 | 4 | 8 |
| $N=438$ | 164 × 3 | 44 × 12 | 72270 | 37413 | 1.93 | 6 | 5 | 12 |
| $F=23.3\%$ | 164 × 3 | 22 × 23 | 72270 | 27777 | 2.60 | 6 | 6 | 16 |
| $n_{tp}=17680$ | 123 × 4 | 11 × 46 | 54312 | 22959 | 2.37 | 8 | 7 | 20 |
|  | 123 × 4 | 6 × 92 | 54312 | 20769 | 2.62 | 8 | 8 | 22 |
| b22s | | | | | | | | |
| $n_{ff}=735$ | 368 × 2 | 108 × 7 | 177489 | 79702 | 2.23 | 4 | 4 | 10 |
| $N=481$ | 245 × 3 | 54 × 14 | 118326 | 53728 | 2.20 | 6 | 5 | 14 |
| $F=23\%$ | 245 × 3 | 27 × 28 | 118326 | 40741 | 2.90 | 6 | 6 | 18 |
| $n_{tp}=27245$ | 184 × 4 | 14 × 56 | 88085 | 34488 | 2.58 | 8 | 7 | 20 |
|  | 184 × 4 | 7 × 112 | 88085 | 31121 | 2.86 | 8 | 8 | 24 |

*Fig. 9*

(1) For each test pattern $t_i$, $(i = 1 \ldots N)$

Enable *TestMode*;

For each row $r_j$, $(j = 1 \ldots m)$ (1)   Read row $r_j$/update MISR;

(D1)  Scan out MISR, reset MISR;

For each conflicting columns in $r_j$ (2)   Update scan-cell;

Progress to the next row;

(D2) Scan out MISR, reset MISR;

Disable *TestMode*;

(3) Toggle normal clock (test response capture);

(4) Scan out MISR;

*Fig. 13*

PROGRESSIVE RANDOM ACCESS SCAN CIRCUITRY

BACKGROUND OF THE INVENTION

1. Technical Field

The invention relates to systems and methods for testing circuits. In particular, the invention relates to systems and methods for testing very large scale integrated (VLSI) circuits.

2. Related Art

VLSI circuits typically include hundreds of thousands or millions of transistors on a single integrated circuit. The VLSI circuits may be tested for physical defects, such as those introduced by imperfections in the manufacturing process or aging of the devices. However, the very high transistor count and circuit density of VLSI circuits make them extremely difficult and expensive to test comprehensively. In particular, sequential circuit testing for VLSI circuits is considered impractical due to computational complexity of the sequential test pattern generation, necessitating design for testability (DFT) techniques to test the VLSI circuit. One type of DFT technique is serial-scan, whereby the storage elements in a circuit can be reconfigured for serial shift in and out operation to attain the desired controllability and observability with relatively low hardware overhead.

Serial scan requires that the storage elements (e.g., flip flops or FFs) in the circuit use specially designed scan-cell flip flops (SSC) that are connected to form a serial shift-register (or a collection of shift registers) during test mode (as shown in FIG. 1b). FIG. 1a shows an example of a serial-scan cell (SSC). The serial scan-cell includes a flip flop 100 and multiplexor 102. Because the serial-scan cell is a multiplexer based design, the multiplexor at the input of each flip-flop selects between the combinational path in normal mode (e.g., non-test mode) and the output of the previous flip-flop in test mode, as shown in FIG. 1a. An example serial scan implementation is shown in FIG. 1b. During normal mode, the flip-flops capture the normal data from the combinational logic circuit. When test mode is selected, each flip-flop receives its input from the previous flip-flop in the scan chain and feeds the next flip flop. Once the states of the flip-flops are set by the scan-in operation (see "Scan In" in FIG. 1b), normal mode may be selected and the next state data may be captured by toggling the clock. Captured data may be scanned out (see "Scan Out" in FIG. 1b) by switching back to test mode.

As shown in FIGS. 1a and 1b, serial scan has relatively low hardware overhead, including scan routing, test mode signal routing, and additional gates for each flip-flop. Thus, serial scan has been accepted by the industry due to its ability to provide high fault coverage and ease of test generation. However, serial scan suffers from several problems. First, serial scan causes higher switching activity in the circuit which in turn results into higher power consumption during the scan operation than during normal operation. The voltage droop and excessive heat dissipation caused by the high power consumption during testing may produce incorrect responses even for circuits with no actual defects. Further, the high heat dissipation may damage the circuit under test, resulting in yield loss. Second, serial scan has a relatively long test application time and a greater test data volume due to the serial nature of the scan. Specifically, for any performed test (even for a test that only requires a small fraction of the scan cells to be set or updated during the test), each test vector and test response must be fully shifted in and out through the entire scan chain.

Several methods have been developed to address the problems of serial scan. One method is random access scan, whereby each storage element in a sequential circuit has a unique address and is individually written or read by addressing it. FIG. 2a shows an example of a random access cell (RAC). As shown in FIG. 2a, the random-access cell includes a flip flop 100 and two multiplexors 200, 202. Multiplexor 200 is for addressing the individual random-access cell using X & Y enable lines. Multiplexor 202 receives as input a mode signal to determine whether the cell is operating in normal or test mode. An example random access scan implementation is shown in FIG. 2b. The random access cell may be individually addressed using the row and column enable decoders. Outputs from the row and column enable decoders may be used to select a single random access cell, as shown in FIG. 2b. Thus, for n number of cells, the random access scan structure allows the reading or writing of any flip-flop in the circuit using $\log_2 n$ address bits. The address may be applied by either a parallel manner using multiplexed primary inputs or a serial manner using an address shift register.

Because random access scan may individually address the cells, many of the problems associated with serial scan may be overcome. For example, random access scan reduces the test power significantly since the unnecessary switching activity created by scan-shifting is eliminated. Further, the test cost, including test application time and test data volume, is reduced using random access scan. However, random access scan suffers from significantly high hardware overhead as compared to serial scan. In particular, the overhead for each of the individual cells is higher, due to the additional multiplexors, and the overhead for the architecture is higher due to the excessive routing for enable lines and data signal routing.

What is needed is a system and method for testing circuits which overcomes the problems of the prior art.

SUMMARY

A method and circuitry for testing an integrated circuit is provided. In one aspect of the invention, the circuitry comprises a scan cell, referred to as a Progressive Random Access Scan cell (PRAS cell), that may test an integrated circuit. The PRAS cell may comprise of one or more pass transistors in addition to a storage element (such as a latch or a flip flop). Since the PRAS cell may consist of one or more pass transistors, the area of the PRAS cell may be less than the area of other scan cells used in the prior art, such as the Random Access Scan cell or serial scan. Further, the configuration of the pass transistors in the PRAS cell, may improve testability of the circuit and may introduce little or no performance degradation. For example, one or more pass transistors may be configured in the scan cell so that they are not in the critical path of the storage element. Specifically, the critical path may be defined as the path that the signal travels (such as from the output to the input of the storage element). Since the one or more pass transistors do not reside in the critical path, the operation of the scan cell may be quicker.

The PRAS cell may be operated in a non-test mode and in a test mode. In a non-test mode, the PRAS cell may be adapted to operate as the storage element. In a test mode (where the integrated circuit may be tested), the PRAS cell may be adapted to operate both structurally and functionally as a Static Random Access Memory (SRAM) cell. For example, in a test mode, the PRAS cell may comprise a feedback group of two inverters accessed by one or more data lines, and may include one or more pass transistors.

The PRAS cell may be addressable, such as having one or more input control lines to individually access the scan cell. In a Random Access Scan Cell of the prior art, there may be many lines necessary for the cell, such as two lines to address the scan cell (e.g., as a row line and a column line), a line to enable the cell (e.g., a test mode signal), a line to deliver input data to the scan cell and the routing of lines, and line to output data from the scan cell. In the PRAS cell of the present invention, fewer lines may be used, thereby decreasing the amount of space necessary for the scan cell. As one example, one of the address lines (such as the row enable line) may be used not only to address the PRAS cell, but may also be used to enable the cell. Thus, a separate line to enable the cell (such as a separate test mode signal line) is unnecessary. As another example, one of the address lines (such as the column enable line) may be used not only to address the PRAS cell, but may also be used to input/output data to the scan cell.

The PRAS cell may be used for various types of testing. One type of testing comprises reliability or fault testing, whereby data is scanned it, a clock is applied, and data is obtained from the circuit. For example, predetermined write operations may be made for various storage elements in the integrated circuit and predetermined read operations may be made for various storage elements. The data obtained from the read operations may be used to determine whether the integrated circuit under test is reliable. Another type of testing comprises performance testing, whereby testing is directed to whether the integrated circuit may operate at a certain speed. The PRAS cell for performance testing may be staged, with a first pattern applied and then a second pattern applied. The PRAS cell may be adapted to performance testing by applying different clock signals to the various sections of the PRAS cell. For example, one section of the PRAS cell may operate using a clock cycle of $\Phi_1$ and another section of the PRAS cell may operate using a clock cycle of $\Phi_2$. $\Phi_2$ may be different from $\Phi_1$. For example, $\Phi_2$ may be based on $\Phi_1$, such as $\Phi_1$+HOLD, where HOLD may be an additional time period to test the performance of the integrated circuit.

In another aspect of the invention, a plurality of PRAS cells may be arranged in the integrated circuit, with additional peripheral and test control logic. The peripheral and test logic may be configured in order to reduce the area required for the plurality of PRAS cells. Further, the plurality of PRAS cells may be arranged on one or more grid like structures. For example, the PRAS cells may be arranged in a single m×n grid (where m may or may not be equal to n) in order to reduce or minimize the routing overhead. As another example, the PRAS cells may be arranged in multiple grids. Multiple grids may be used when the number of test pins to the integrated circuit may vary, enabling more efficiency (such as shorter test time). Specifically, if there are more test pins available on the integrated circuit, a single grid may be divided into two or more grids to accelerate testing.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

FIG. 1b depicts a block diagram of an implementation of the serial scan cell depicted in FIG. 1a.

FIG. 2b depicts a block diagram of an implementation of the random access cell depicted in FIG. 2a.

FIG. 5 illustrates one example of the pseudo-code for test application in PRAS architecture.

FIG. 8b is a block diagram vertical partitioning of the PRAS grid depicted in FIG. 8a.

FIG. 8c is a block diagram horizontal partitioning of the PRAS grid depicted in FIG. 8a.

FIG. 9 is a table showing test application time of experimental results for PGRAS.

FIG. 13 illustrates one example of the pseudo-code for test application in PGRAS architecture, which is a modification of the pseudo-code illustrated in FIG. 5.

DETAILED DESCRIPTION OF THE PREFERRED EMBODIMENTS

By way of overview, the preferred embodiments described below relate to a progressive random access scan (PRAS) system and method. The PRAS system may be used to test any type of circuit, such as microprocessors, ASICs, System-on-a-Chips (SoC), or any other type of digital or mixed signal circuit. For example, in SoC testing, test resource partitioning and test scheduling for several cores to reduce overall test application time with constrained test power consumption is a concern. The PRAS architecture, discussed below, may provide reduced test application time with negligible power consumption, and may be used on SoC cores. The PRAS system thus provides non-destructive scan testing for diagnosis, and may provide delay fault testing.

The PRAS system includes a new architecture, both at the cell level as well as at the system level. As discussed in more detail below, the PRAS cell may include a storage element, such as a latch, a flip-flop, or any other memory device, and pass transistors that are not in the critical path of the circuit. Further, the number of control lines to and from the cell may be reduced. In one aspect, the PRAS cell has a structure and functionality similar to static random access memory (SRAM) or grid-addressable latch, and may achieve considerably smaller transistor count and routing overhead than conventional Random Access Scan architectures. With PRAS, the test power consumption problem may be reduced or eliminated by updating only one scan-cell at a time. Further, the PRAS method may reduce the test data volume and test application time. As discussed in more detail below, a test application may include a traveling salesman problem (TSP) formulation. Experimental results, detailed below, may compare test application time, test data volume, test power consumption and hardware overhead to a multiple serial-scan method using the same number of test pins or test channels. The results show that the PRAS system and method may significantly reduce test application time and test data size with negligible power consumption.

Figure 1A:
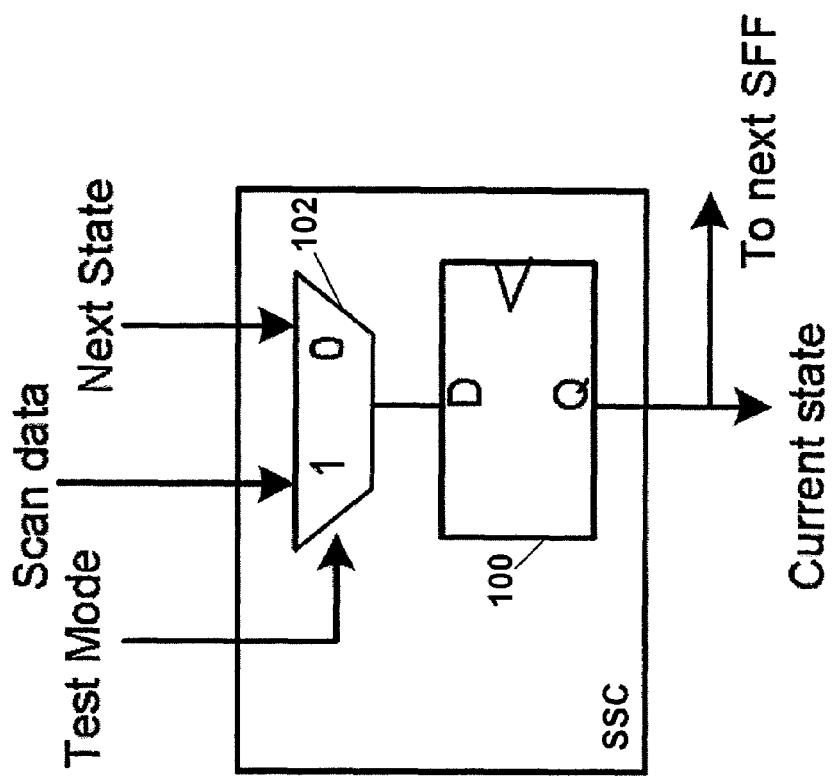
FIG. 1a depicts a block diagram of a serial-scan cell.
Figure 1B:
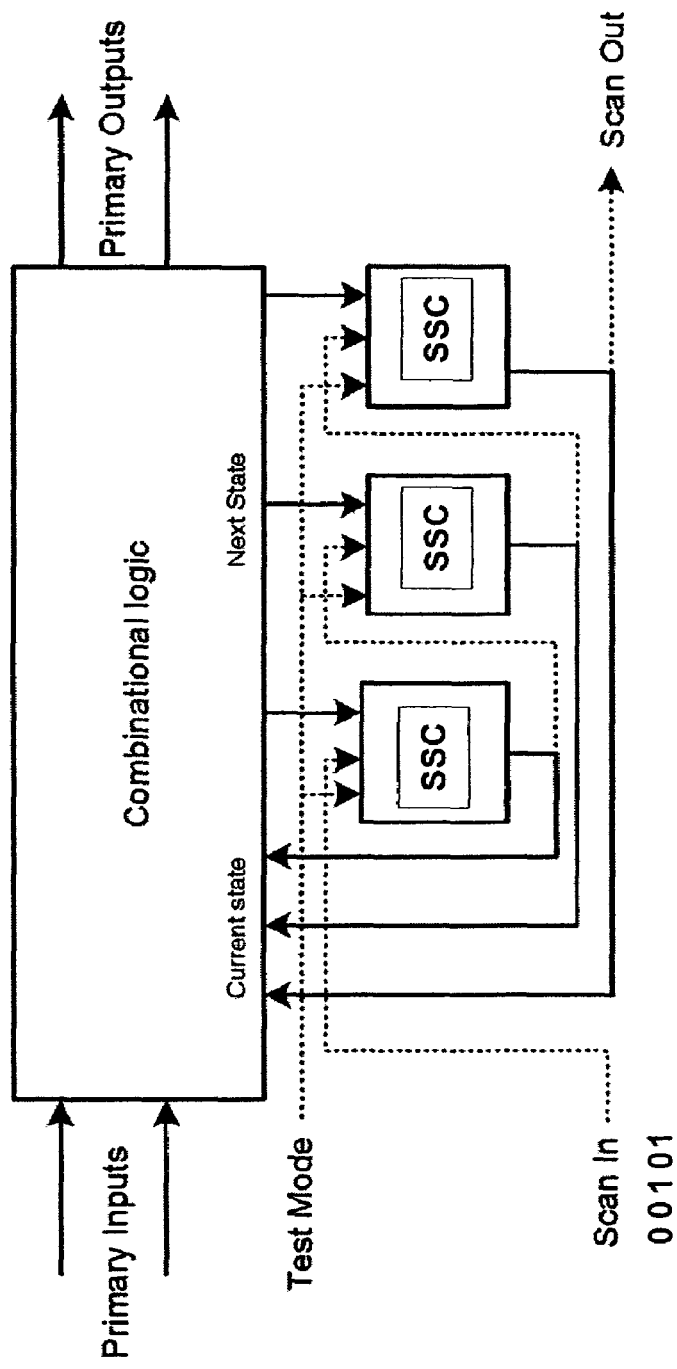
Figure 2A:
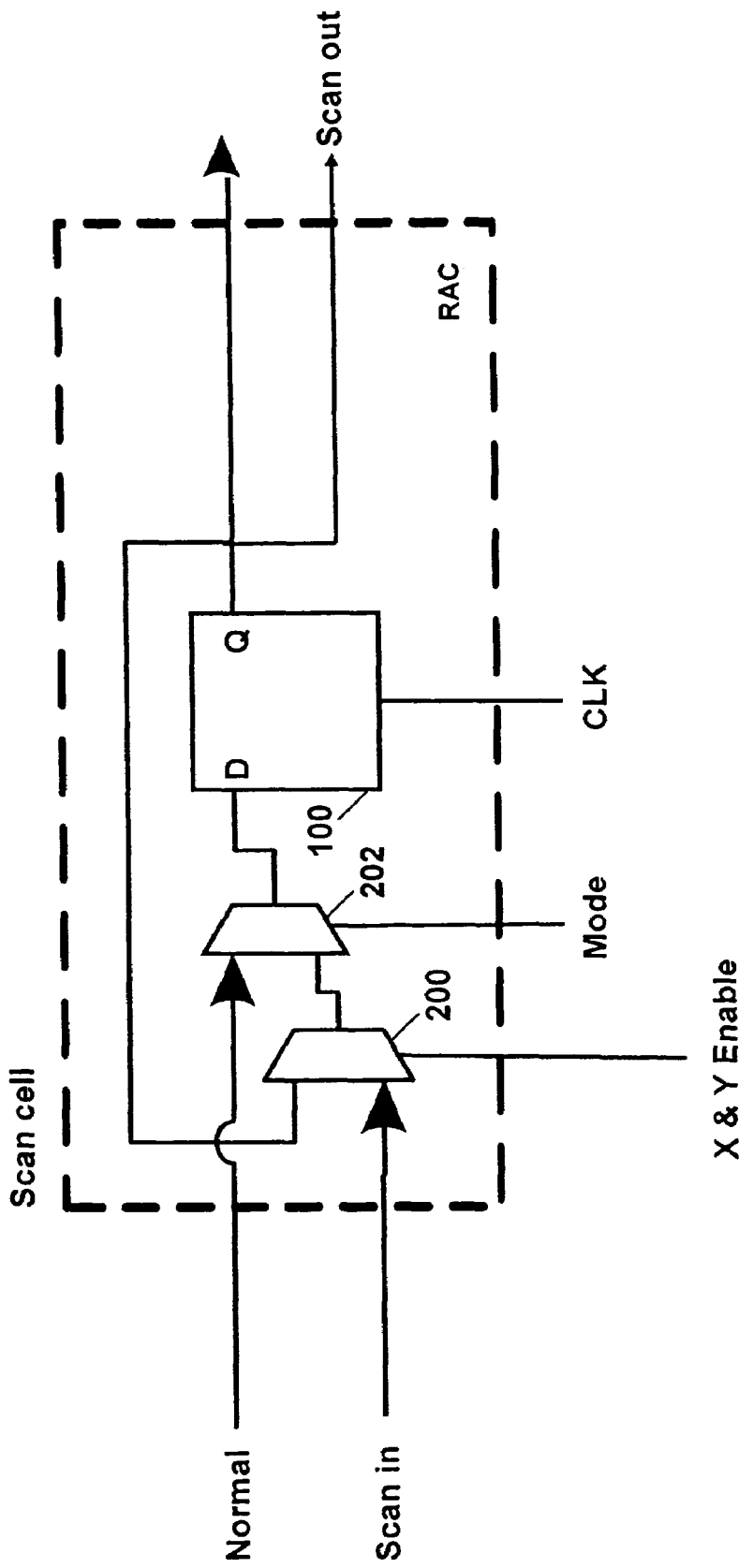
FIG. 2a depicts a block diagram of a random access cell.
Figure 2B:
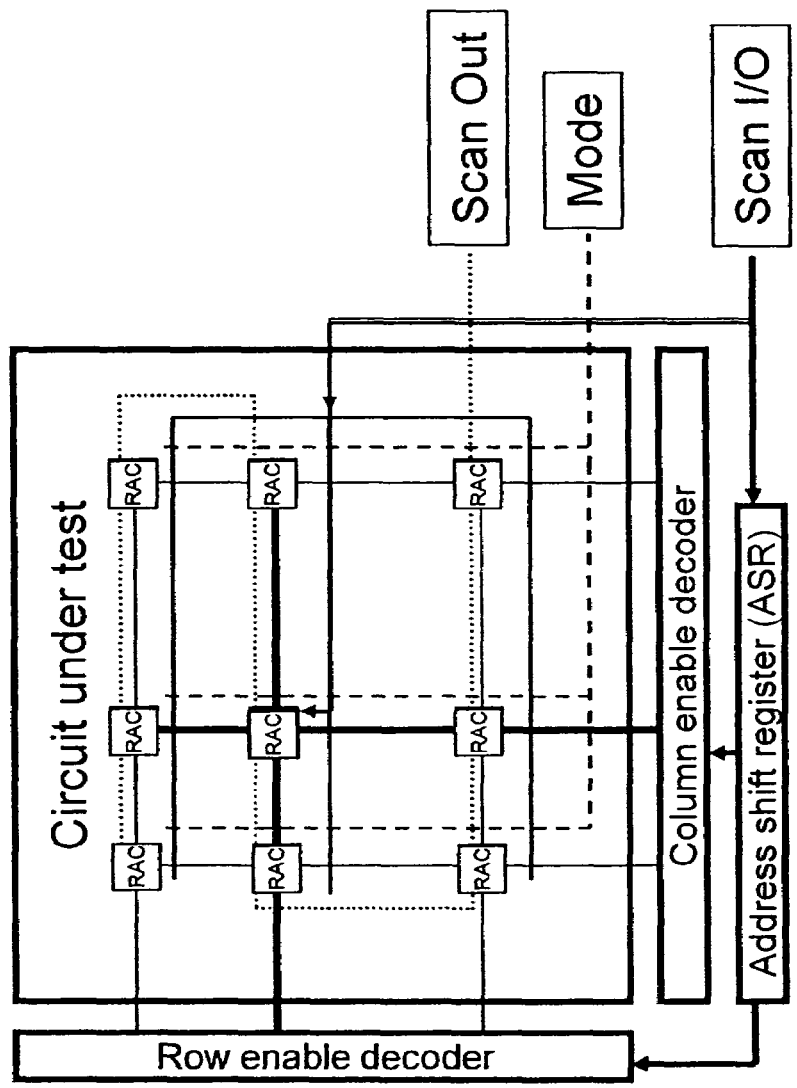
Figure 3A:
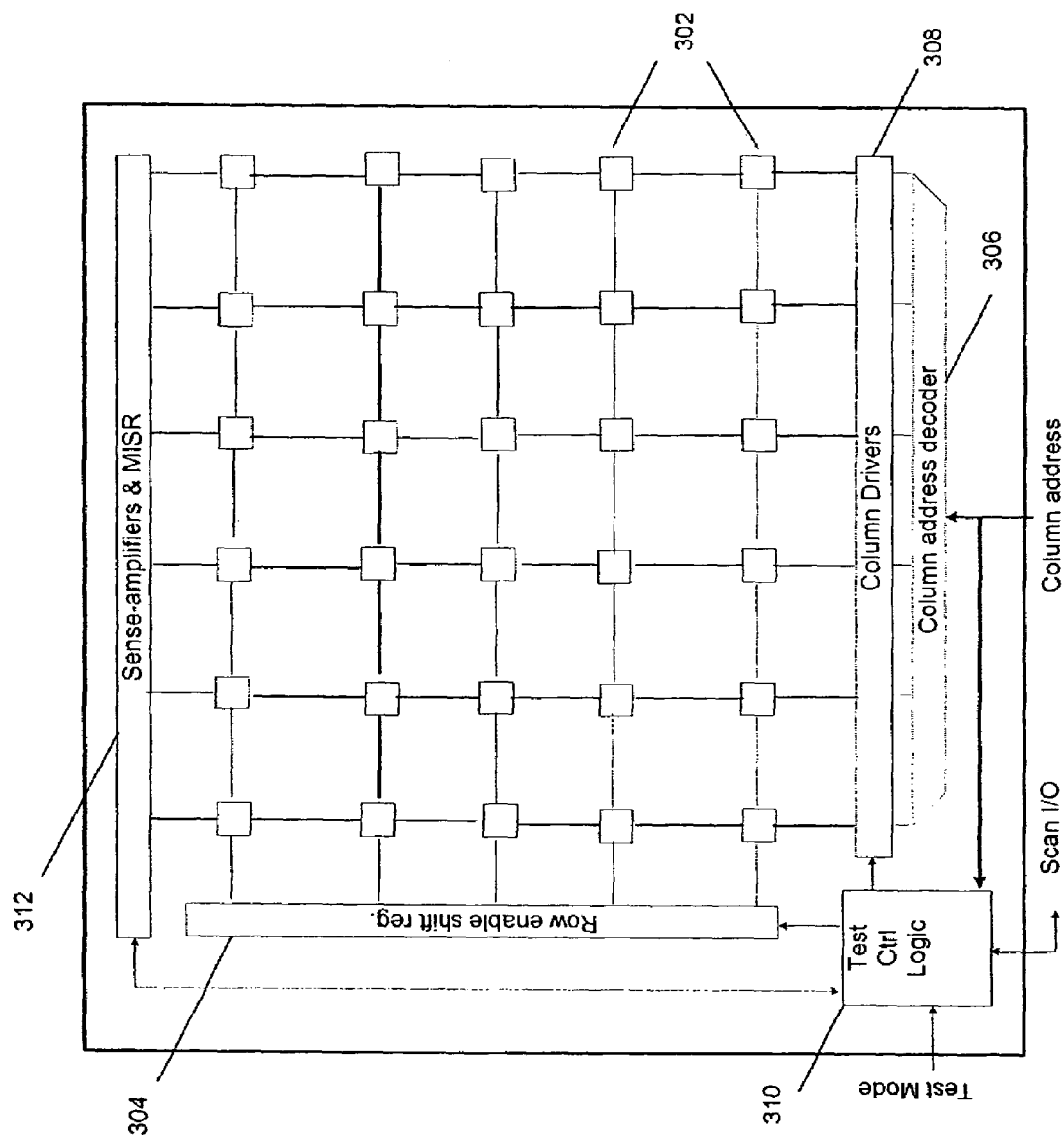
FIG. 3a illustrates a block diagram of one example of a PRAS architecture, composed of multiple PRAS cells.

FIG. 3a illustrates one example of a PRAS architecture 300, composed of multiple PRAS cells 302. In the PRAS architecture, PRAS cells 302 may be configured in a grid configuration. For example, FIG. 3a illustrates a single grid, with an m×n grid structure, whereby m may or may not be equal to n. Alternatively, the PRAS architecture may be composed of multiple grids, such as 2, 3 or more grids, as discussed in more detail below. FIG. 3a also illustrates additional peripheral and test control logic. The PRAS cells 302 may be addressable using a first address and a second address (such as a row and a column).

Further, the additional control logic may include a first address decoder, such as a row decoder. As shown in FIG. 3a, the row decoder may comprise a row enable shift register 304. The row enable shift register 304 may be enabled by the test control logic. For example, the test mode signal, input to Test Control Logic 310, may control whether the row enable shift register 304 generates an output, with the row enable shift register 304 generating an output when the test mode signal is high (to conduct a test) and not generating an output when the test mode signal is low (normal operation). The additional control logic may also include a second address decoder, such as a column address decoder 306. As described below, the column decoder may be used to control column drivers 308 to drive values to the individually addressed columns of the scan cells. Finally, FIG. 3a shows sense amplifiers & multiple input signature register (MISR) 312, which may be used to read data from the scan cells, as discussed below.

The number of rows and columns may be decided by the geometry of the circuit or the number of available test pins or test channels. Similarly and as discussed in more detail below, the grid configuration may be modified or partitioned, depending on the geometry of the circuit and/or the number of available test pins or test channels. During test mode, PRAS cells in one of the m-rows may be enabled, allowing it to be read or written by the horizontal row enable signal available from the row enable shift register. The read/write operation on scan-cells in the PRAS architecture may be performed as described below.

For the read operation, the states of the scan-cells in the enabled row may be passed to the sense-amplifier through the vertical bidirectional scan-data lines. The sense-amplifier and the column driver connected to each scan-data line may insure the completion of read (write) operation within a clock cycle. The data read from the scan-cells in a row are passed to a multiple input signature register (MISR) or any other type of test response compactor which compacts the test response where compacted test response called 'signature'. Hereinafter, MISR represents any type of test response compactor.

Figure 3B:
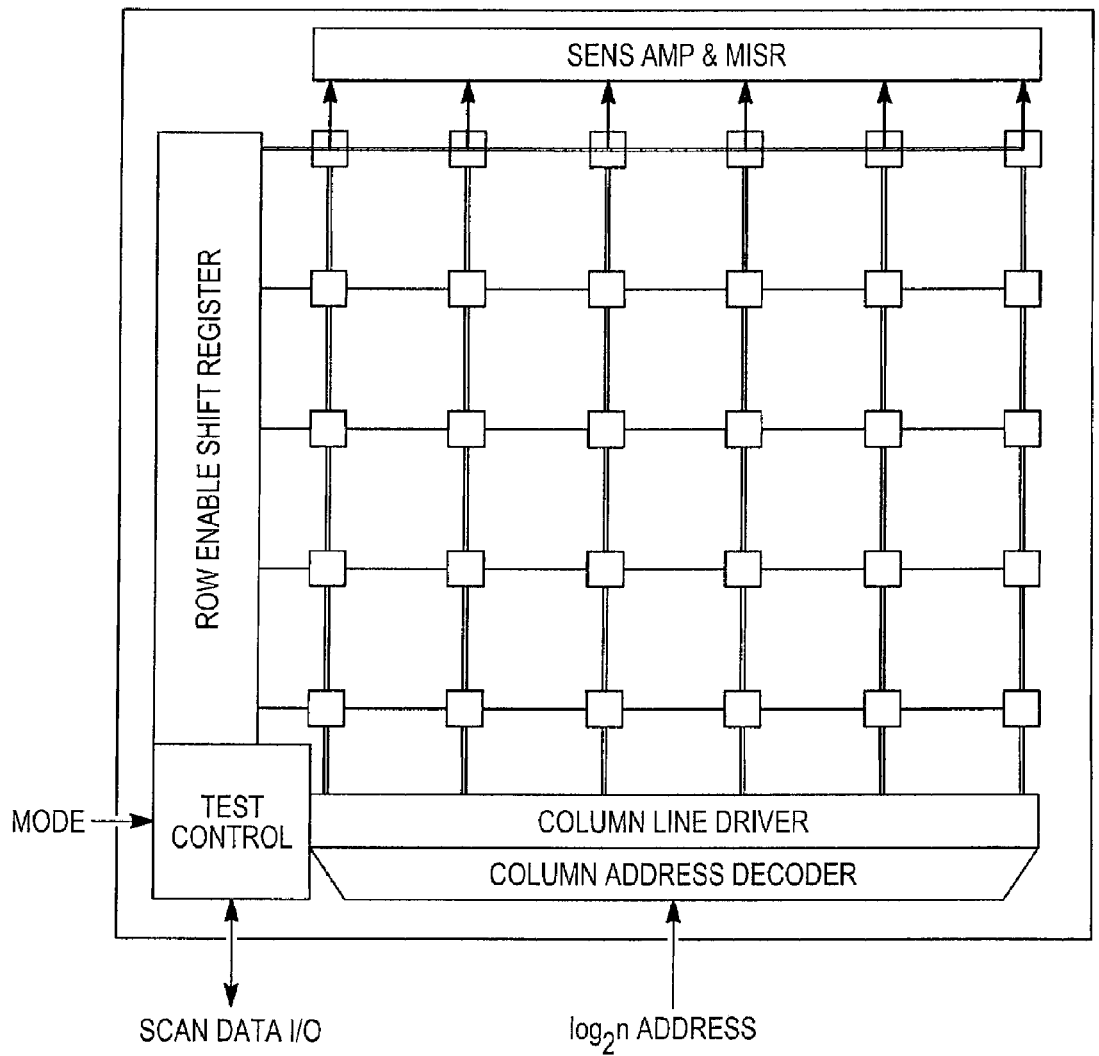
FIG. 3b illustrates an operation for the block diagram depicted in FIG. 3a whereby a row (depicted as the uppermost row) is read and sent to the MISR.

When in test mode, the clock signal Φ may be held high. Further, the row enable shift register may enable a specific row (such as RE=1, discussed below). For the read operation, the states of the scan-cells in the enabled row may be passed to the sense-amplifier through the vertical bidirectional scan-data lines. The sense-amplifier and the column driver at the opposite ends of each scan-data line may insure the completion of read (write) operation within a clock cycle. The data read from the scan-cells in a row may be passed to a multiple input signature register (MISR) which calculates the signature of the test responses. Referring to FIG. 3b, there is shown an operation whereby a row (depicted as the uppermost row) is read and sent to the MISR.

Figure 3C:
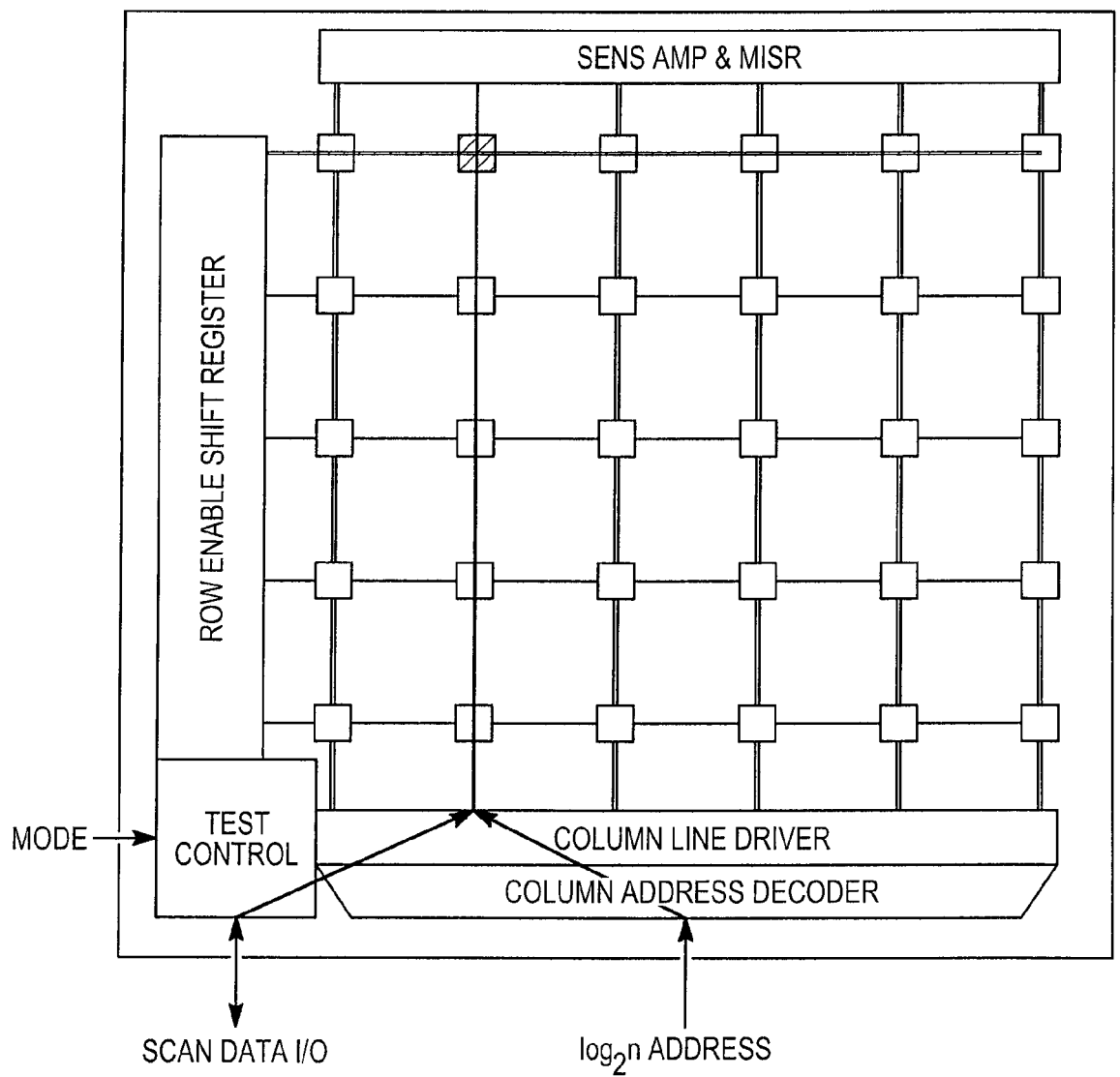
FIG. 3c illustrates an operation for the block diagram depicted in FIG. 3a whereby each scan cell may be updated, with the updated scan cell depicted in FIG. 3c as the test vector highlighted.
Figure 3D:
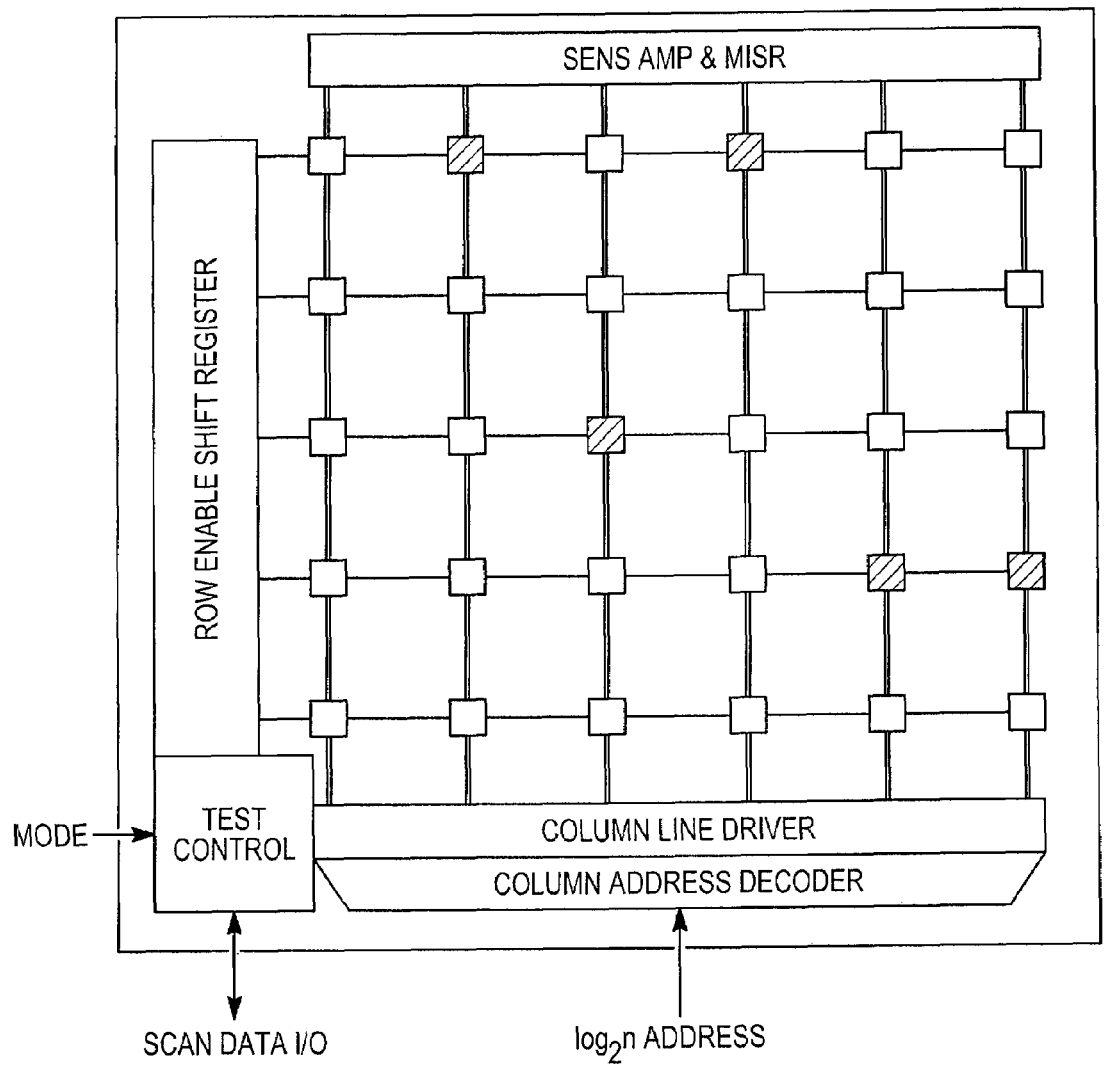
FIG. 3d illustrates an operation for the block diagram depicted in FIG. 3a whereby a plurality of cells are updated.

While reading may be performed in parallel on all the scan-cells in a row, the write operation may be performed on one scan-cell at a time, reducing or minimizing the switching activity and the associated circuit power consumption. To write a single scan-cell, the column address may be supplied through $\log_2 n$ column address pins and the value to be written may be supplied through the scan I/O pin. This is depicted in FIG. 3c. The column address decoder may generate a column enable signal to enable one of the columns in the grid. Specifically, the decoded column enable signal may activate the corresponding column driver for writing to the scan cell that is in the addressed column of the currently selected row with the desired scan-in data. Each scan cell may be updated, with the updated scan cell depicted in FIG. 3c as the test vector highlighted. Further, the testing may proceed in any manner, such as proceeding downward row by row, reading out the data and then updating a cell in the row if one of the cells is to be updated. Once all the write operations are done for the currently selected row, the next row may be read by shifting the row enable signal and activating the MISR at the same time. This may be followed by the write operations. These read/write cycles may be progressively performed for all the rows in the circuit. An example of a plurality of cells updated is shown in FIG. 3d.

In order to perform the read/write operations described above, control signals for the peripheral circuit may be generated by the test control logic. The test control logic may provide three different test modes, which are: 1) progress to the next row and read, 2) write to the addressed column, and 3) scan-out the contents of MISR. To provide these test modes without adding external test control pins, two column addresses may be reserved for the first and the third test modes. Applying other values/addresses to the address pins sets the PRAS to the second (write to the addressed column) mode.

Figure 4A:
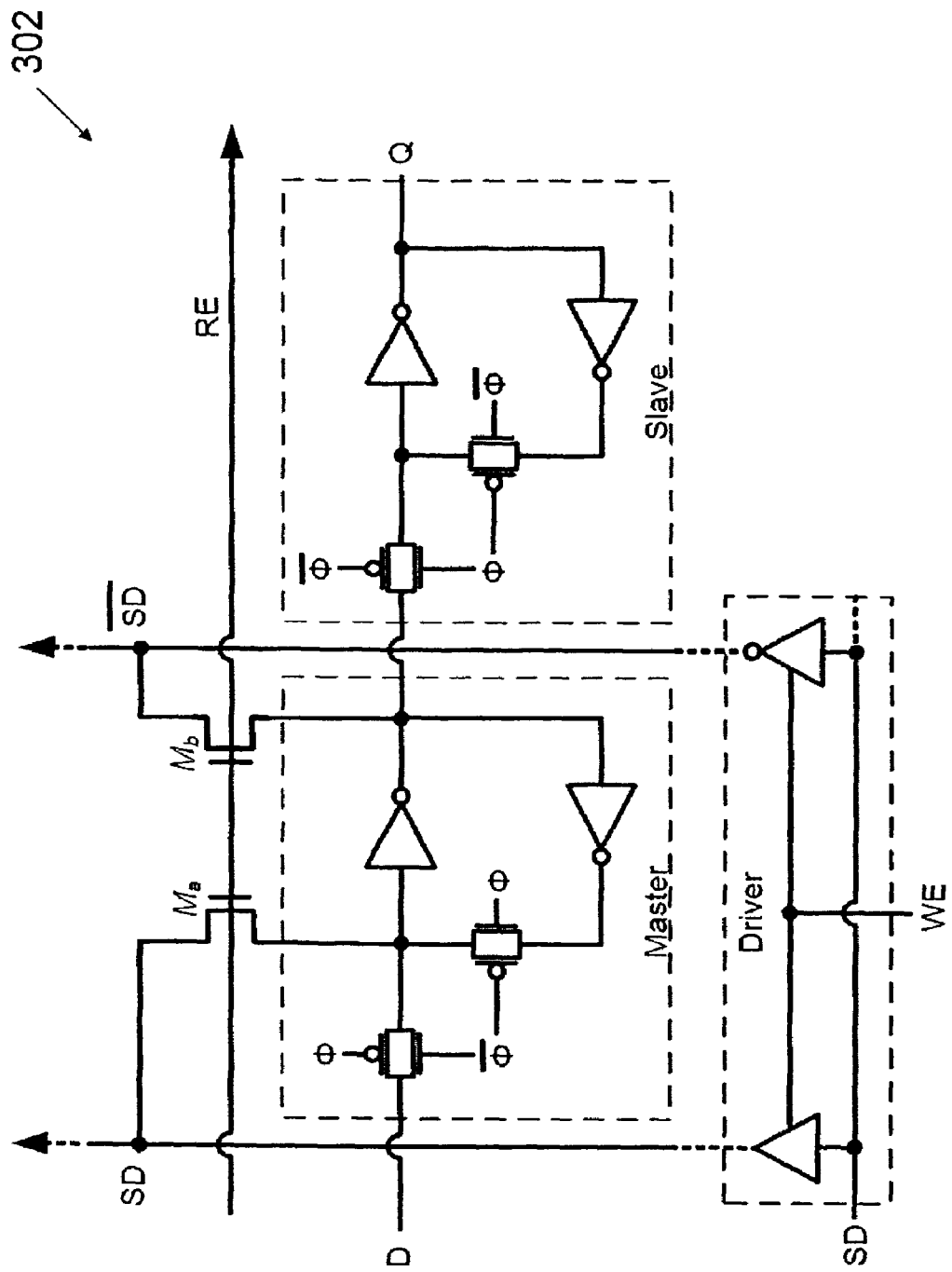
FIG. 4a illustrates a block diagram of one example of a PRAS cell.
Figure 4B:
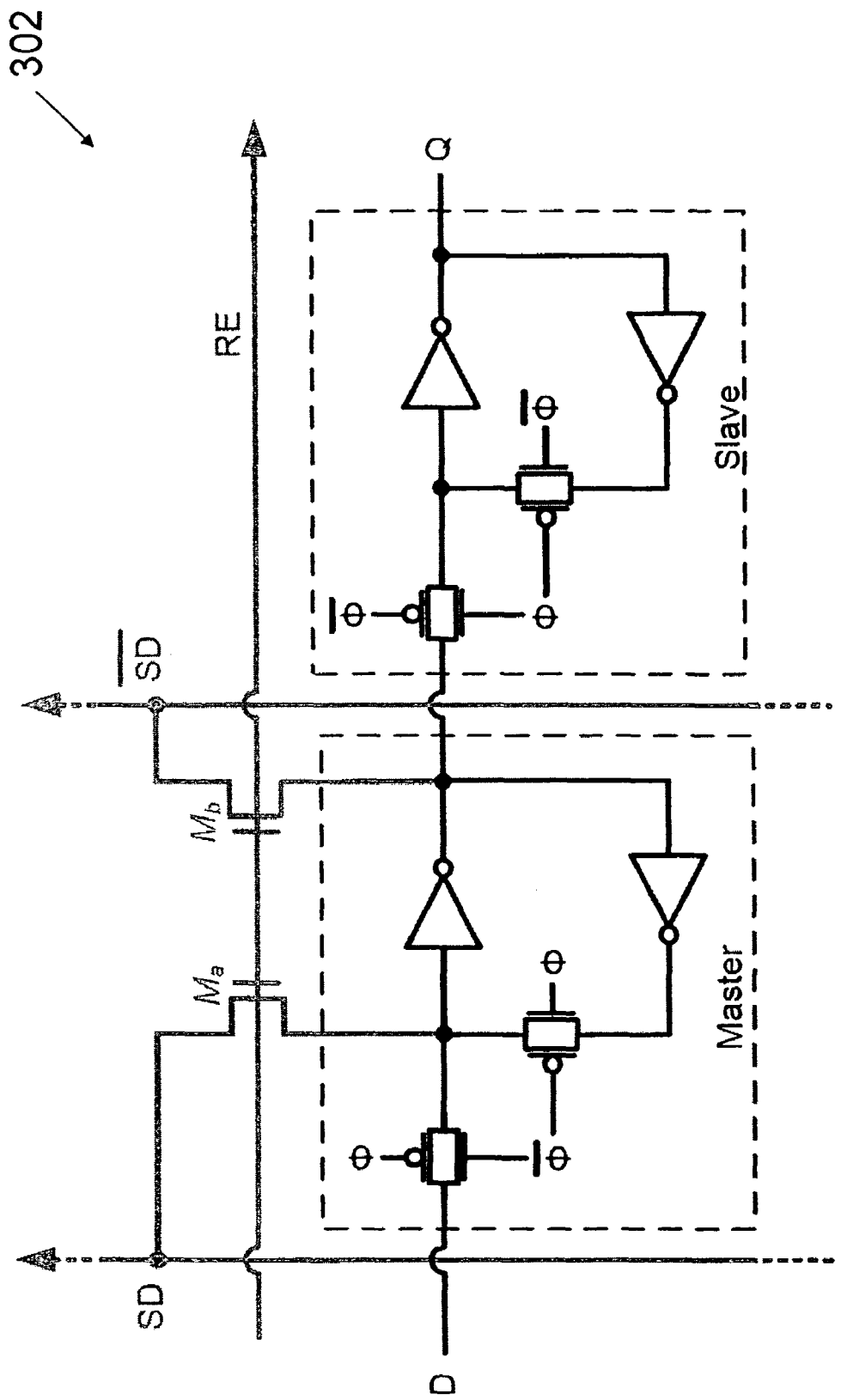
FIG. 4b illustrates a block diagram of the PRAS cell depicted in FIG. 4a for normal or non-test operation.
Figure 4C:
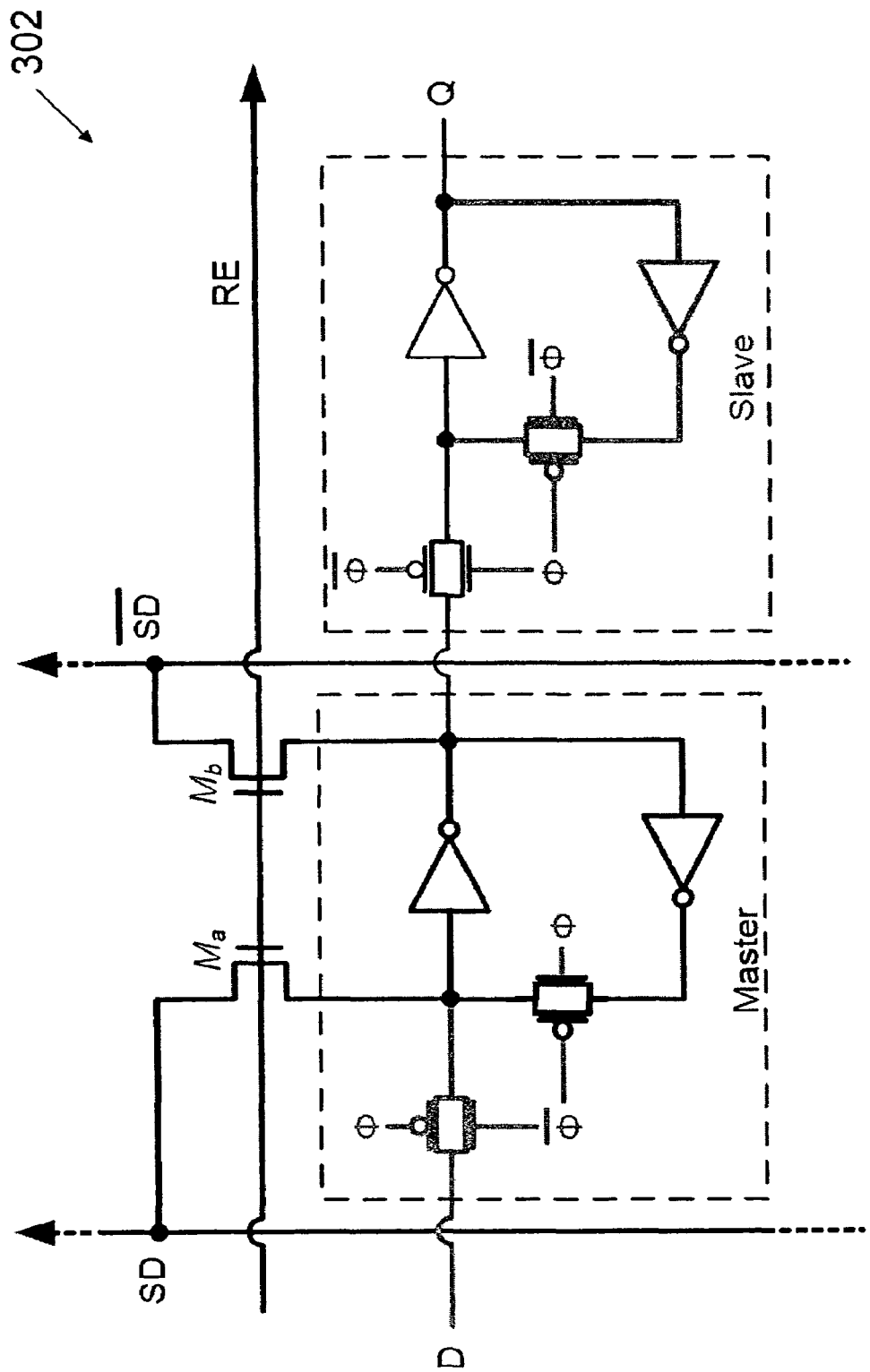
FIG. 4c illustrates a block diagram of the PRAS cell depicted in FIG. 4a for test operation.

FIG. 4a discloses one example of a PRAS cell 302. The PRAS cell 302 may include a storage element and additional circuitry to address the scan cell, write data to the scan cell, and read out data from the scan cell 302. For example, one, some, or all of the storage elements in a circuit may be modified to include the additional circuitry in order to achieve the SRAM-like read/write operation in the PRAS architecture described below. FIG. 4a shows a scan-cell 302 that includes a traditional positive edge triggered, D-type flip-flop. The additional circuitry may consist of one or more transistors, such as pass transistors $M_a$ and $M_b$, shown in FIG. 4a added to the master stage. For performance, two pass transistors may be used in order to more quickly drive the storage element or may be used to drive differential circuitry in the MISR. However, one pass transistor may be used or three or more pass transistors may be used. Because one, two or more pass transistors are used, this may enable small area and performance overhead for the PRAS cell. Further, as shown in FIGS. 4a-c, the pass transistors, $M_a$ and $M_b$, are not on the critical path of the logic. For example, the pass transistors are not in the circuit path form the output of the flip-flop to the input to the flip flop. This placement of the additional circuitry (such as the one or more pass transistors) off of the critical path avoids performance degradation for normal operation and enables a quicker test application time for scan operation. Thus, the PRAS cell is in contrast to a traditional Random Access Scan cell, which includes multiplexor circuitry in the critical path, thereby requiring a larger area than the pass transistors in the PRAS cell and necessitating a slower test and normal system operation.

The row enable signals (RE) may be connected or in communication with the gate of the pass transistors. For normal or non-test operation, all horizontal row enable signals (RE) may be set to 0. Therefore, each scan-cell 302 may acts as a regular flip-flop since $M_a$ and $M_b$ disconnect the flip-flop from the scan-data lines SD and $\overline{SD}$. This is depicted in FIG. 4b, with the darker lines in the circuit active and the lighter lines inactive. During normal operation, Φ may be an oscillating clock signal. While the test mode is enabled (RE=1 for at least one row in the grid), the clock Φ may be held to 1 and the normal data (D) from the combinational path may be captured in the feedback loop of master stage. The PRAS cell 302 during testing is depicted in FIG. 4c. While Φ is kept at 1, the feedback loop of the master stage, together with $M_a$ and $M_b$ transistors, forms a traditional 6-transistor SRAM cell, and hence a read or write operation may be performed as in SRAM described below. Specifically, the 6 transistors include two transistors for each inverter in the storage unit, and the $M_a$ and $M_b$ pass transistors.

As shown in FIG. 4a, the SD and $\overline{SD}$ lines may be connected to or in communication with the pass transistors (such as connected to the source or drain of the pass transistors). A read operation may be performed for all scan-cells in a selected row. To read a selected row, RE of a selected row may be set to 1 while all the column drivers 308 may be deactivated. Then, the captured data in the feedback loop propagates through SD and $\overline{SD}$ to the sense-amplifier circuit. The data read from a selected row may update the MISR to calculate a signature from the test response.

The column drivers 308 may include an input, an output, and a control line. The input to the column drivers 308 may be the input data line to test the integrated circuit (such as the scan input line depicted in FIG. 3a). The output to the column drivers may comprise the input data line (SD) or its complement ($\overline{SD}$). The control line to the column drivers 308 may be the output of the column address decoder 306. As stated above, write operations may be performed on one PRAS cell at a time as follows. To write or update the state of a scan-cell in the activated row, the column driver 308 of the addressed column may be activated, using the control line to the column driver, and the sense-amplifiers may be deactivated. The signal driven by the column driver may be delivered through SD and $\overline{SD}$, and may overwrite the master stage feedback loop of the selected row, similar to a typical SRAM write operation. As a result, the scan-in value may be directly injected only to the feedback loop of the cell in the addressed column of the selected row.

In the PRAS architecture, the first pattern in the test set may be applied by writing to some or all scan-cells in the circuit. For the remaining patterns, the test responses may be used as templates for the next test pattern. Pseudo primary input (PPI) and pseudo primary output (PPO) may be used to represent scan-in data and test response, respectively. In one embodiment, only the conflicting values between current PPO and the corresponding PPI of the next test vector are updated. In other words, a scan-cell may need to be updated if the current value of a scan cell is unknown or opposite to the corresponding PPI value of the next test vector. In contrast, if the PPI value of the next test vector has don't-care (x) or it is the same value as the corresponding PPO, then no update is required.

The following notations may be defined for use in the following detailed test cost.

| | |
|---|---|
| T | Given test set |
| N | Number of test patterns in T |
| m | Number of rows in PRAS |
| n | Number of columns in PRAS |
| $n_{add}$ | Number of address pins in PRAS |
| $n_f$ | Number of storage-cells (flip-flops) in the circuit |
| $n_{PI}$ | Number of primary inputs of circuit under test |
| $t_i$ | i-th test vector in test set T |
| $i_i$ | Pseudo primary input part of $t_i$ |
| $o_i$ | Pseudo primary output (test response) part of $t_i$ |
| $c_{i,j}$ | Number of write operations for the jth row when updating $o_i$ to $i_{i+1}$ |
| $n_w$ | Total number of write operations to apply test set T |

One example of the pseudo-code for test application in PRAS architecture is listed in FIG. 5. The test application for each vector may start by enabling TestMode and holding the clock high. Each scan-cell row $r_j$ may be selected sequentially and the states of the cells in the selected row may be read to update the MISR in step (1). Once a selected row is read, the conflicting bits between $o_{i-1}$ and $i_i$ in the row $r_j$ may be updated by supplying the addresses and scan-in values of the corresponding columns in step (2). Following this, the next row may be selected and read progressively, until there are no more rows to be read and updated. Once all the m rows are read and updated, the TestMode may be disabled and the test response $o_i$ may be captured by applying the normal clock in step (3) and the result may be read when $t_{i+1}$ is applied in the next iteration. For the last pattern $t_N$, the test responses may be read without any write operations. The last step (4) may be to read out the signature from the MISR.

Assuming the clock frequency for the testing is constant, the test application time may be proportional to the total number of clock cycles needed for testing. With the test application scheme described above, the total number of test cycles, t, for the PRAS architecture may be computed using the following equation, assuming the MISR width is the same as number of columns(n):

$$t = \sum_{i=1}^{N} (\sum_{j=1}^{m} (1 + c_{i,j}) + n \quad (1)$$

Considering that the clocks are needed only for the step (1) reading, step (2) updating scan-cells, step (3) test response capture, and step (4) scan-out MISR signature, the pseudo-code in FIG. 5 may be directly used to derive equation (1). This may be further simplified to:

$$t = N \cdot (m+1) + n_w + n \quad (2)$$

Each test vector for the PRAS may be composed of primary input data and address/value pairs of updated scan-cells.

Using a method similar to the one used for computing the total number of clocks, an expression may be derived for the test data volume, d, given below:

$$d = N \cdot n_{PI} + N \cdot m \cdot n_{add} + (n_{add}+1) \cdot n_w + n_{add} \cdot n \quad (3)$$

where $n_{add} = \lceil \log_2 n \rceil$.

As the total number of flip-flops, n×m, in a design is constant, equations (2) and (3) may offer a trade-off between test application time t and the test data volume d. Such a trade-off may be achieved by varying the geometry of the scan-cell grid. Decreasing the number of rows m may reduce t while the test data volume may increase due to the increase in $n_{add}$ required to cover all scan-cells in the circuit, and vice versa. However, the actual scan-cell grid may be determined by the locations of scan-cell distribution and the number of available test pins for column addressing. As discussed in more detail below, one or more partitions may be used based on the available test pins. In contrast, reducing the total number of write operations $n_w$ may reduce both the test application time and the test data volume. The techniques to reduce $n_w$ are discussed below.

There are several techniques to minimize the total number of write operations ($n_w$) for a given test set. Two examples of the techniques include test vector ordering and Hamming distance reduction. The following example provides an illustration of the techniques.

Example test set values for the pseudo primary input (PPI), which may represent scan-in data, for a circuit with 6 scan-cells and the corresponding pseudo primary output (PPO) values, which may represent the test response, for each vector are listed in Table 1 below. If the test vectors are applied in the order of $t_1 \rightarrow t_2 \rightarrow t_3 \rightarrow t_4$, then the number of write operations, $n_w$, is 10 excluding initialization. However, if the same test set is applied as, then $t_1 \rightarrow t_2 \rightarrow t_3 \rightarrow t_4$ may be reduced to 5. Thus, finding the optimal order of test vectors may significantly reduce $n_w$.

TABLE 1

Example test set

| Vector | PPI ($i_j$) | PPO ($o_j$) |
|---|---|---|
| $t_1$ | 00x10x | 00x10x |
| $t_2$ | 00x110 | 01x011 |
| $t_3$ | x00100 | 00x101 |
| $t_4$ | 110x01 | 11010x |

For Hamming distance reduction, modification of test vectors is considered to reduce or minimize $n_w$. Suppose that the first bit in $i_4$ may be replaced with (x) (denoted as a don't-care) without loosing the fault coverage. By filling the last bit of $i_1$ from (x) to 1—the faults not detected by $i_4$ with x may now be detected by $i_1$ with x-filling. Then, the $n_w$ of the ordered test set above may be 4 instead of 5, achieving further reduction in $n_w$. The following describes these techniques in greater detail.

The test vector ordering problem may be formally stated as follows: For a given PRAS circuit C and test set T, to find an optimal order of T such that $n_w$ is reduced or minimized. The problem may be reduced to an asymmetric traveling salesman problem (ATSP) that finds the asymmetric shortest Hamiltonian path for a graph constructed as follows. First, test set T is simulated on the fault free circuit and PPI values ($i_j$) and PPO values ($o_j$) of T are extracted. Using all pairs of $i_j$ and $o_j$, a complete, weighted, asymmetric graph G=⟨V, E⟩ is constructed, where:

| V = | {$v_i$\|$v_i$ is an ($i_i$, $o_i$) pair of $t_i$} |
| E = | {$e_{ij}$\|$e_{ij}$ is an edge from vertex $v_i$ to $v_j$} |
| w($e_{ij}$) = | Number of write operation to change $o_i$ to $i_j$ |

Figure 6:
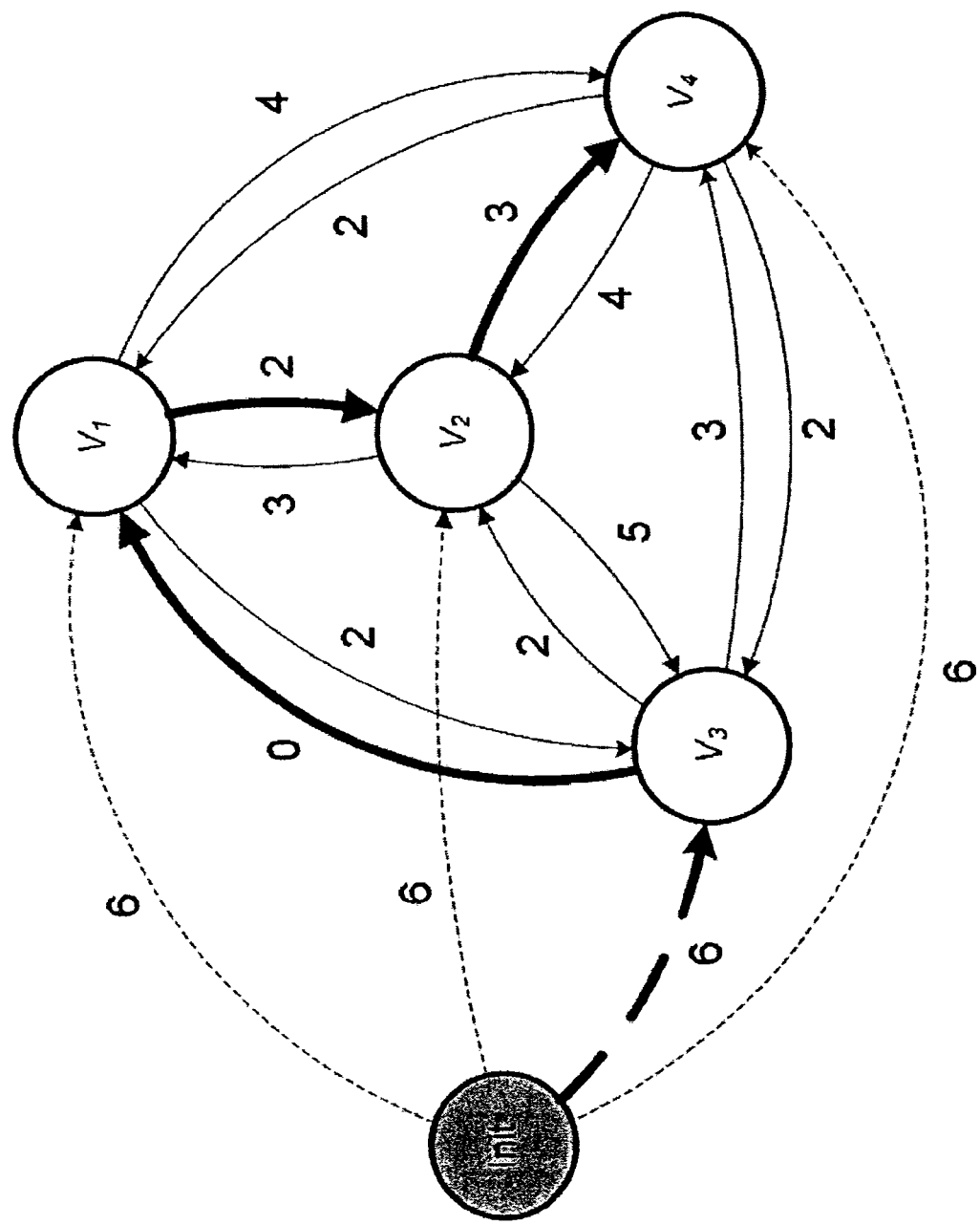
FIG. 6 is an illustration of a Hamming distance graph for an example test set.

Also, an "init" vertex may be added to G so that the ATSP tour starts from the unknown state. The weight of initialization edges may be set to $n_{ff}$ since all scan-cells may be written for the application of the first test vector. The initialization may be done for all scan-cells because of signature calculation in the MISR. The graph is called a Hamming Distance graph (HD-graph). FIG. 6 shows the HD-graph for the example test set in Table 1. Self loops and edges from all vertices to the dummy vertex are omitted since those edges are not required while computing the optimal tour. The shortest Hamiltonian path on the constructed HD-graph may directly represent the order of test vectors, since all the vertices (test vectors) are visited (applied) once with the smallest distance ($n_w$). The ATSP is a known NP-hard problem Therefore, a heuristic based approximation algorithm may be used. The vector order problem was solved using a Lin-Kernighan heuristic for the traveling salesman problem. The optimal tour obtained for the example test set T is drawn with bold edges in FIG. 6 and has $n_w$=11 including the initialization.

Generally, a test set may be used to test a circuit comprising fully specified vectors, since don't care values (x's) may be filled during a compaction procedure. However, even in the highly compacted test vectors, some of specified values may be changed to x's without loosing fault coverage or expanding the test set. A method called Don't-care identification may be used to identify x's on specific bits in the test set. Since x values in PPI do not require write operation with the PRAS architecture, identifying them may be useful in reducing $n_w$. Therefore, Don't-care identification may first be used to modify the initial test vector so that the PPI part of the test set contains maximum number of x's. The HD-graph obtained from this modified test set may be used for the test vector ordering method. On the other hand, x's in the PPO values may be eliminated since a write operation is always required if the corresponding PPI value is specified. This suggests a modification of Don't-care identification method and iteration of the Don't-care identification and logic simulation procedure after test vector ordering, as described below.

With regard to an ordered vector simulation, once the test vectors are ordered, they may be simulated and x's in the PPIs ($i_j$) may be filled with PPO values of the previous test vector ($o_{i-1}$) since those bits may not be updated by write operations and the previous PPO values will remain constant for $i_j$. This ordered vector simulation with filling unspecified values has two effects. First, x's in the $o_i$ may be changed to specified values that may match with the corresponding values of the next PPI ($i_{i-1}$). Second, specified bits in the PPI part of another test vector are allowed to become x's, since more faults can be detected by $t_i$ when it is fully specified. Both of these two effects may lead to further reduction in $n_w$.

Figure 7A:
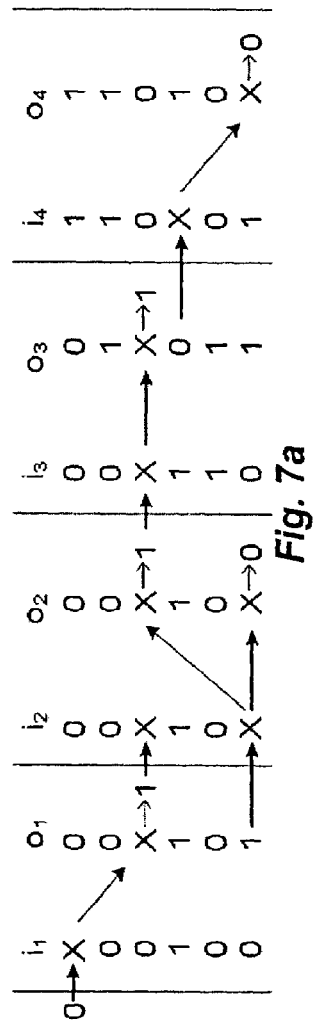
FIGS. 7a-c illustrates an example of Hamming distance reduction after ordering with FIG. 7a filling x's by ordered vector simulation, FIG. 7b identifying don't care on odd vectors, and FIG. 7c identifying don't care on even vectors.

The process may be explained using an example in FIG. 7a. The test set may be obtained by applying the test vector ordering method on the example test set given in Table 1, thus, ordered as $t_3 \rightarrow t_1 \rightarrow t_2 \rightarrow t_4$. In FIG. 7a, arrows represent the filling procedure. For example, one may assume that filling an x in the sixth bit of $i_2$ induced the third and sixth bits in $o_2$ to change from x to 1 and 0 respectively. In this case, the write operation for the sixth bit in $i_3$ is no longer required and $n_w$ may be reduced.

Once x's are filled with ordered vector simulation (see FIG. 7a), Don't-care identification may be used again by targeting specific bit positions that require updates. Consider ordered PPI vectors $i_{i-1}$, $i_i$, and $i_{i+1}$ with corresponding PPOs of $o_{i-1}$, $o_i$ and $o_{i+1}$. To reduce write operations, $o_{i-1}$ and $i_i$ may be compared first, then the bits that require write operations may be targeted for Don't-care identification. If some of the targeted bits in $i_i$ are converted to x's, then the corresponding write operations may be reduced. Next, those bits with x's may be filled with the previous values in $o_{i-1}$ and re-simulated to update $o_i$. However, this procedure may increase the number of writes since changes in $i_i$ can affect some matched bits between $o_i$ and $i_{i+1}$. To avoid such an increase, the Don't-care identification method may be modified to allow additional constraints at the PPOs such that the targeted bits in $i_i$ can only be converted to x if it does not affect already matched bits between $o_i$ and $i_{i+1}$. This constrained Don't-care identification procedure may alternately be applied to the group of odd vectors and the group of even vectors until no more improvement is possible.

Figure 7B:
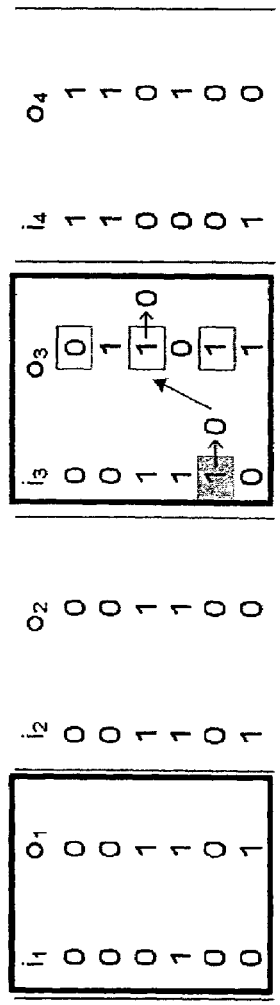
Figure 7C:
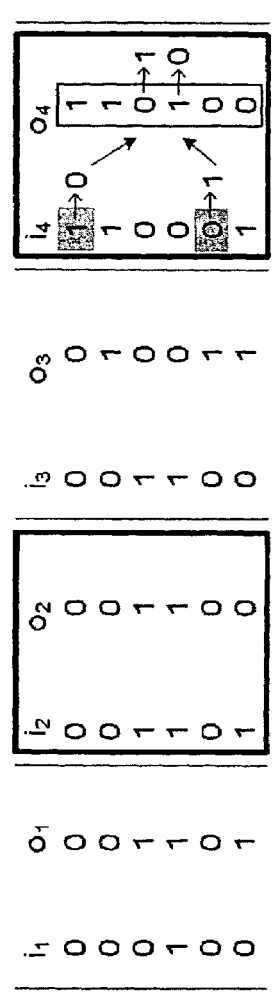

FIGS. 7b and 7c provide an exemplary illustration of this procedure. In FIG. 7b, the constrained Don't-care identification may be applied for the odd vectors first and the shaded value in $i_3$ is a target. For the output constraints, only the boxed values in $o_3$ may be allowed to change since the other bits are already matched with $i_4$. For example, suppose the fifth bit in $i_3$ can be converted to x, then this bit may be be replaced by its corresponding value in the previous state (0) and it is simulated to update $o_3$. Although, $o_3$ may or may not change, the number of write operations can not increase. In the example above, the third bit in $o_3$ is shown to change, and as a result, two write operations are removed for both the forth bit in $i_3$ and the third bit in $i_4$.

After the constrained Don't-care identification is applied to the odd vectors, it may be applied to the even test vectors as shown in FIG. 7c. The procedure may be repeated on odd and even vectors, as long as reduction in $n_w$ continues. The process may eventually terminate.

The following are experimental results that cover three different aspects of the test architecture discussed above. The experimental results are merely for illustrative purposes. First, the PRAS architecture may be implemented on the large ISCAS89 and ITC99 circuits, and the hardware overhead may be compared with the traditional serial scan method. Then, the test application time and test data size may be compared to the traditional multiple-serial-scan (MSS) method with the same number of test pins. Finally, the test power consumptions of the proposed method and the traditional multiple scan method may be compared. The results on hardware overhead, test application and test data reduction, and test power consumption are summarized in tables 2, 3 and 4, respectively and the details are described in the following subsections.

The practicality of the described PRAS architecture may feasible provided that the hardware overhead of PRAS is reasonable compare to the conventional MSS architecture. Therefore, the routing and area overhead of the PRAS architecture is compared with the MSS method. In order to estimate routing and area overhead for both the PRAS architecture and traditional serial scan, benchmark circuits are synthesized using SIS package and placement and routing is performed using Dragon. Total wire length and transistor count is estimated for routing overhead and area overhead, respectively.

TABLE 2

PRAS implementation and hardware overhead comparison

| | Circuit statistics | | | Place and route | | | PRAS impl. | | | MSS impl. | | Routing OV | | Trans.OV | |
|---|---|---|---|---|---|---|---|---|---|---|---|---|---|---|---|
| | | | | | | Wire | | | | | | | | | |
| Circuit name | No. FF | No. Gate | No. Tran | x (λ) | y (λ) | len. (λ) | Row (m) | Col (n) | Ad. Wid | Tot. Pin | Tot. Pin | No. Ch | MSS (%) | PRAS (%) | MSS (%) | PRAS (%) |
| s13207 | 669 | 7830 | 33468 | 3273 | 2720 | 656031 | 26 | 26 | 5 | 6 | 6 | 3 | 21.1 | 25.7 | 8.0 | 9.5 |
| s15850 | 597 | 9685 | 37094 | 3949 | 3264 | 1020110 | 24 | 25 | 5 | 6 | 6 | 3 | 16.1 | 20.2 | 6.4 | 7.9 |
| s35932 | 1728 | 16033 | 84116 | 6230 | 5152 | 2071121 | 42 | 42 | 6 | 7 | 8 | 4 | 20.5 | 25.1 | 8.2 | 8.1 |
| s38417 | 1636 | 22073 | 90462 | 5289 | 4352 | 1907023 | 40 | 41 | 6 | 7 | 8 | 4 | 18.5 | 23.0 | 7.2 | 7.2 |
| s38584 | 1452 | 18975 | 90084 | 5742 | 4736 | 2512652 | 38 | 39 | 6 | 7 | 8 | 4 | 15.1 | 19.0 | 6.4 | 6.5 |
| b17s | 1415 | 22615 | 128978 | 7756 | 6432 | 8202860 | 38 | 38 | 6 | 7 | 8 | 4 | 6.8 | 8.7 | 4.4 | 4.5 |
| b20s | 490 | 8853 | 46932 | 4700 | 3904 | 2373826 | 22 | 23 | 5 | 6 | 6 | 3 | 8.3 | 10.7 | 4.2 | 5.4 |
| b22s | 735 | 14260 | 74360 | 5868 | 4864 | 3720134 | 27 | 28 | 5 | 6 | 6 | 3 | 8.1 | 10.4 | 4.0 | 4.6 |

The first and second blocks in Table 2 illustrate the implementation results for the benchmark circuits without any scan insertion. The No.FF and No.Gate columns in the first block list the number of flip-flops and the number of gates before synthesis. The column No.Tran gives the number of transistors when each circuit is synthesized using 16-transistor flip-flops and two or three input CMOS gates. The second block shows the width(x), height(y) and total wire length of placement and routing.

The third and the forth blocks in the Table 2 illustrate the implementation details for the PRAS (PRAS impl.) and multiple-serial-scan (MSS impl.). For the PRAS architecture, the number of rows (m) and the number of columns (n) are chosen to cover all flip-flops in the circuit and to be close to a square grid. Although m and n may be chosen using the trade-offs described above, square grids are used to reflect evenly distributed location of flip-flops. The column under Ad.Wid heading shows the number of address pins and Tot. Pin column gives the total number of test pins used during testing by adding a Scan I/O pin. For a fair comparison with traditional scan, the same or more test pins are allowed for the MSS as shown in Tot. Pin in MSS impl. block. Considering each scan-chain in the MSS requires scan-in pin and a scan-out pin, the number of scan-chains allowed for the MSS is listed in the No.Ch column.

The routing overheads for both MSS and PRAS are provided in the Routing OV block showing the fraction of scan routing length over total routing length for the circuit. Analyzing the table, in all cases, the PRAS architecture has only marginally more routing overhead when compared to the MSS.

Finally, the transistor overhead is compared in the last block, under Trans.OV heading. The fractions of the number of transistors used in scan circuitry over total number of transistors in the circuit are listed in this block. The number of transistor used for each test architecture is counted as follows. For the MSS, transmission gate based multiplexers using 4 transistors are added to each flip-flop. For the PRAS, two transistors (such as two pass transistors) as shown in FIG. 4a are added to each flip-flop. In addition, logic used for the peripheral circuit may be as follows: for the row enable signal, 16-transistor flip-flops may be used for the shift register, and buffers with 4 transistors may be inserted for every 8 scan-cells in every row. For the column address decoder, NOR-based decoder may be used. Each column of PRAS may contain a total of 17 transistors for data write circuitry, cross-coupled sense-amplifier and current-mirror differential sense-amplifier. For a MISR circuit, 16-transistor flip-flops and at most one exclusive-or gate may be added in each column. Thus, the transistor count of the PRAS is similar to that of MSS and even smaller in case of s35932. The hardware estimation as determined in this section demonstrates the practicality of the PRAS architecture as far as routing and transistor overheads are concerned. Moreover, there are numerous other significant benefits, such as test application time, test size, and test power, which are described below.

The proposed test cost reduction methods discussed above may be applied to the benchmark circuits assuming that the circuits are equipped with the PRAS structure given in table 2. The same or more pins are allowed for conventional MSS method. The initial test sets may be highly compacted.

The fourth and fifth blocks compare the test data volume and the test application time of the proposed method with the conventional MSS method. In the Test data volume block, MSS and PRAS columns give the size of test data for multiple-serial-scan and the PRAS, respectively. Under Reduction heading, the reduction rate of the test data volume is given as a percentage. Similarly, the fifth block compares test application time assuming that the scan clock periods of the serial-scan and PRAS operation are the same. From Table 3, it may be observed that the described method simultaneously achieves, on average, nearly 40% reduction in the test data volume and more than 3× speed up in test application time.

TABLE 4

Switching activity during scan

| | Peak sw. activity | | | Average sw. activity | | |
|---|---|---|---|---|---|---|
| Circuit name | MSS (%) | PRAS (%) | Red. (%) | MSS (%) | PRAS (%) | Red. (%) |
| s13207 | 53.59 | 4.21 | 92.14 | 35.41 | 0.129 | 99.64 |
| s15850 | 49.65 | 8.59 | 82.70 | 23.80 | 0.294 | 98.77 |
| s35932 | 73.07 | 0.21 | 99.72 | 2.52 | 0.051 | 97.96 |
| s38417 | 54.82 | 1.47 | 97.32 | 44.88 | 0.002 | 99.99 |
| s38584 | 54.06 | 19.14 | 64.60 | 36.90 | 0.127 | 99.66 |
| b17s | 40.63 | 5.01 | 87.66 | 13.50 | 0.014 | 99.90 |
| b20s | 60.48 | 12.40 | 79.49 | 19.84 | 0.017 | 99.91 |
| b22s | 50.63 | 8.17 | 83.86 | 11.59 | 0.011 | 99.91 |

Because the unnecessary switching activity, caused by scan shifting in the MSS, is reduced or eliminated in the PRAS architecture, the power consumption of the described method may be lowered. For example, in CMOS circuits,

TABLE 3

Test data volume and test application time reduction

| Circuit name | Circuit & Vector stats | | PRAS prop. | | MSS prop. | Test data volume | | | Test application time | | Speed up (x) |
|---|---|---|---|---|---|---|---|---|---|---|---|
| | No. PI ($n_{PI}$) | No. Vec (N) | Reads (N×m) | Writes ($n_w$) | Max. Ch.Leng | MSS (bits) | PRAS (bits) | Red. (%) | MSS (cycles) | PRAS (cycles) | |
| s13207 | 31 | 235 | 6110 | 5043 | 223 | 164500 | 68093 | 58.6 | 52640 | 11414 | 4.6 |
| s15850 | 14 | 97 | 2328 | 4881 | 199 | 59267 | 42284 | 28.7 | 19400 | 7331 | 2.6 |
| s35932 | 35 | 76 | 3192 | 6314 | 432 | 133988 | 66010 | 50.7 | 32908 | 9624 | 3.4 |
| s38417 | 28 | 87 | 3480 | 15203 | 409 | 144768 | 129737 | 10.4 | 35670 | 18811 | 1.9 |
| s38584 | 12 | 114 | 4332 | 13940 | 363 | 166896 | 124940 | 25.1 | 41496 | 18425 | 2.3 |
| b17s | 37 | 617 | 23446 | 24467 | 354 | 895884 | 334774 | 62.6 | 219035 | 48568 | 4.5 |
| b20s | 32 | 438 | 9636 | 17680 | 164 | 228636 | 168276 | 26.4 | 72270 | 27777 | 2.6 |
| b22s | 32 | 481 | 12987 | 27245 | 245 | 368927 | 243797 | 33.9 | 118326 | 40741 | 2.9 |

Table 3 summarizes the results for test data volume and test application time reduction. The table is divided into five separate blocks. The first block contains the circuit and test vector statistics. The number of PIs ($n_{PI}$) is also included to calculate the test data size. The second block gives properties of the PRAS architecture. The first column in PRAS prop. block lists the total number of read operations (n×m) required for the implemented PRAS architecture. The second column of the PRAS prop. block shows the number of write operations required after the proposed test cost reduction methods are performed on the initial test set. The column Max-.Ch.Leng under MSS prop. heading gives the maximum length of scan chain used in the MSS when the same or one more test pins are allowed as shown in Table 2.

switching activity of the circuit elements is the dominant portion of power consumption. Therefore, the percentage of circuit elements whose output values switch was measured. Simulation of the scan operations in the conventional MSS and the proposed PRAS method estimate power consumption was performed. In table 4, the second block, Peak sw. activity, compares the peak activities in the circuit. The numbers listed in the MSS and PRAS column are the maximum percentages of gates whose output values switch at scan clocks. The Red. column in this block gives the reduction of peak switching activities in percent. The average switching activities are compared in the last block. As predicted, the average switching activities of the PRAS method are negligible compared to those of the MSS. The described PRAS method has more than 99% reduction in switching activity compared to the conventional method in all benchmark circuits.

As discussed above, a single grid for the PRAS architecture may be used. Alternatively, a multiple PRAS structure may be implemented by partitioning a circuit into several blocks. Using multiple PRAS structures may include partitioning into different sections, such as grids, and may be termed Partitioned Grid Random Access Scan (PGRAS).

Figure 8A:
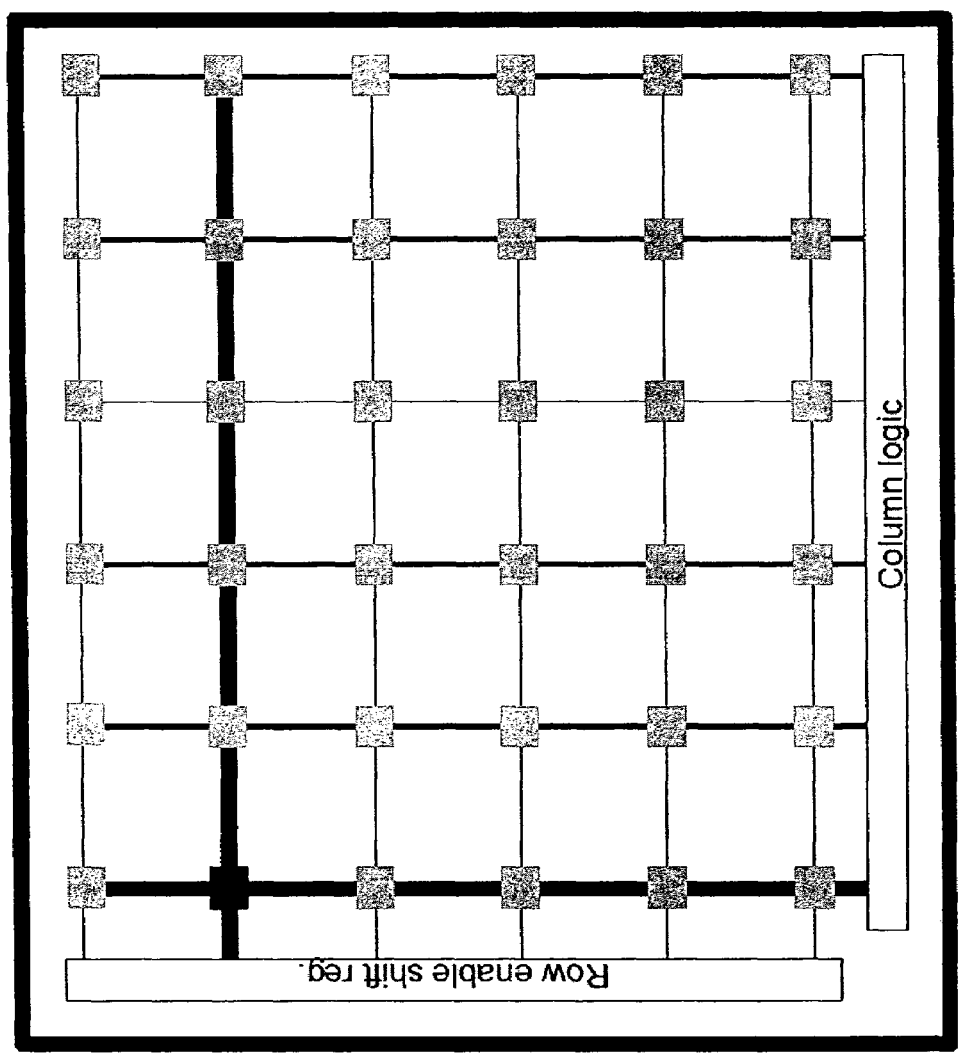
FIG. 8a is a block diagram of an example of a PRAS grid.

As discussed above, the m×n grid structure of PRAS may be configured by the distribution of scan-cells to minimize the routing overhead. An example of the grid is shown in FIG. 8a. In this architecture, the number of columns n and the number of address pins $\log_2 n$ may be predetermined by the gird configuration, regardless of the number of available test pins or test channels. However, in practice, the number of test channels available may be fewer or greater than $\log_2 n$. For example, the test access port (TAP) on a SoC is usually very narrow, therefore, fewer then $\log_2 n$ test channels may be allowed. On the other hand, if there is an abundance of test channels on ATE, these channels may be utilized to further reduce the test application time. In such cases, the grid may be reconfigured to have smaller or larger number of columns. However, in adjusting the number of columns, one may not wish to significantly alter the physical grid since it is chosen to minimize the routing overhead. Thus, the following method and structure to partition the PRAS grid to form a PGRAS architecture may provide flexibility to the number of address pins while not significantly affecting the routing overhead.

Figure 8B:
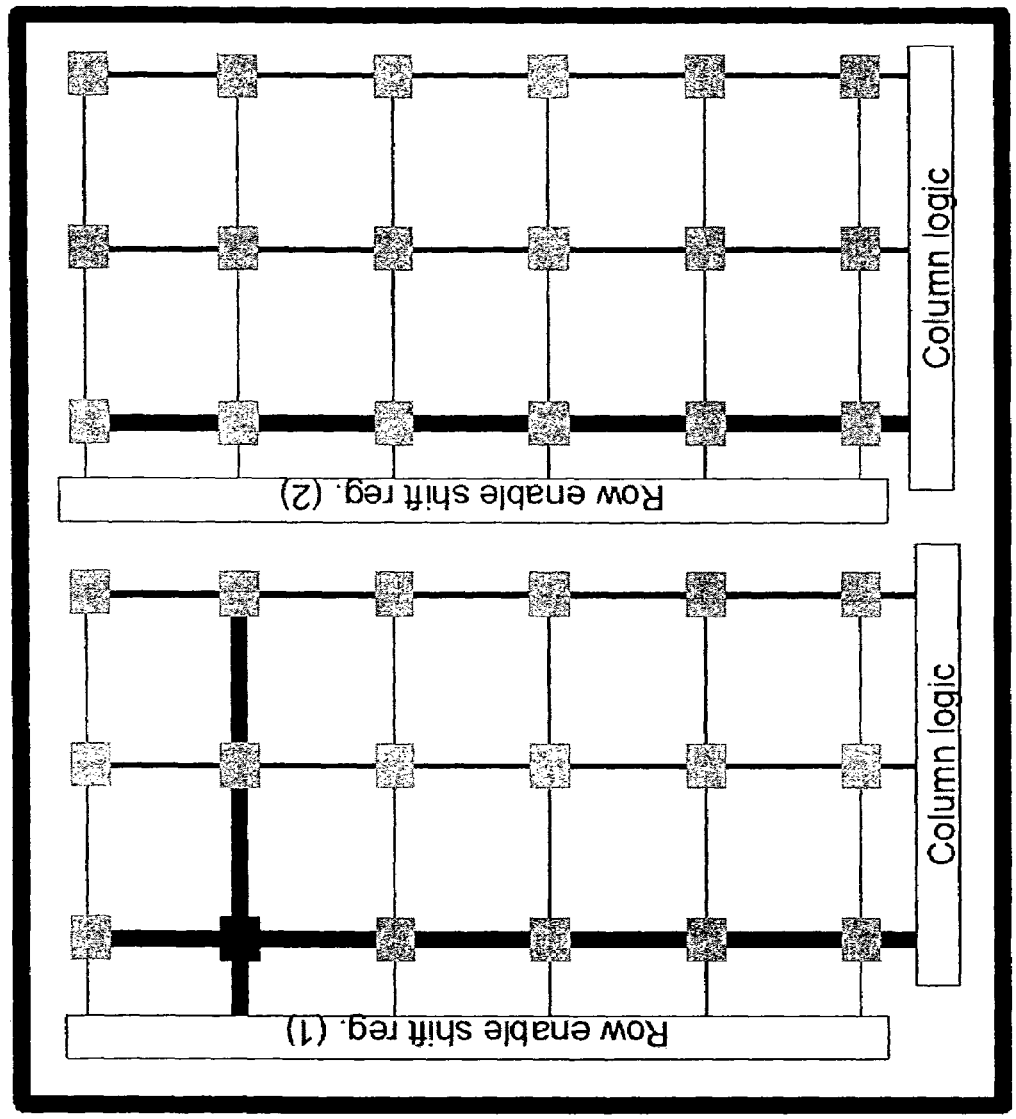
Figure 8C:
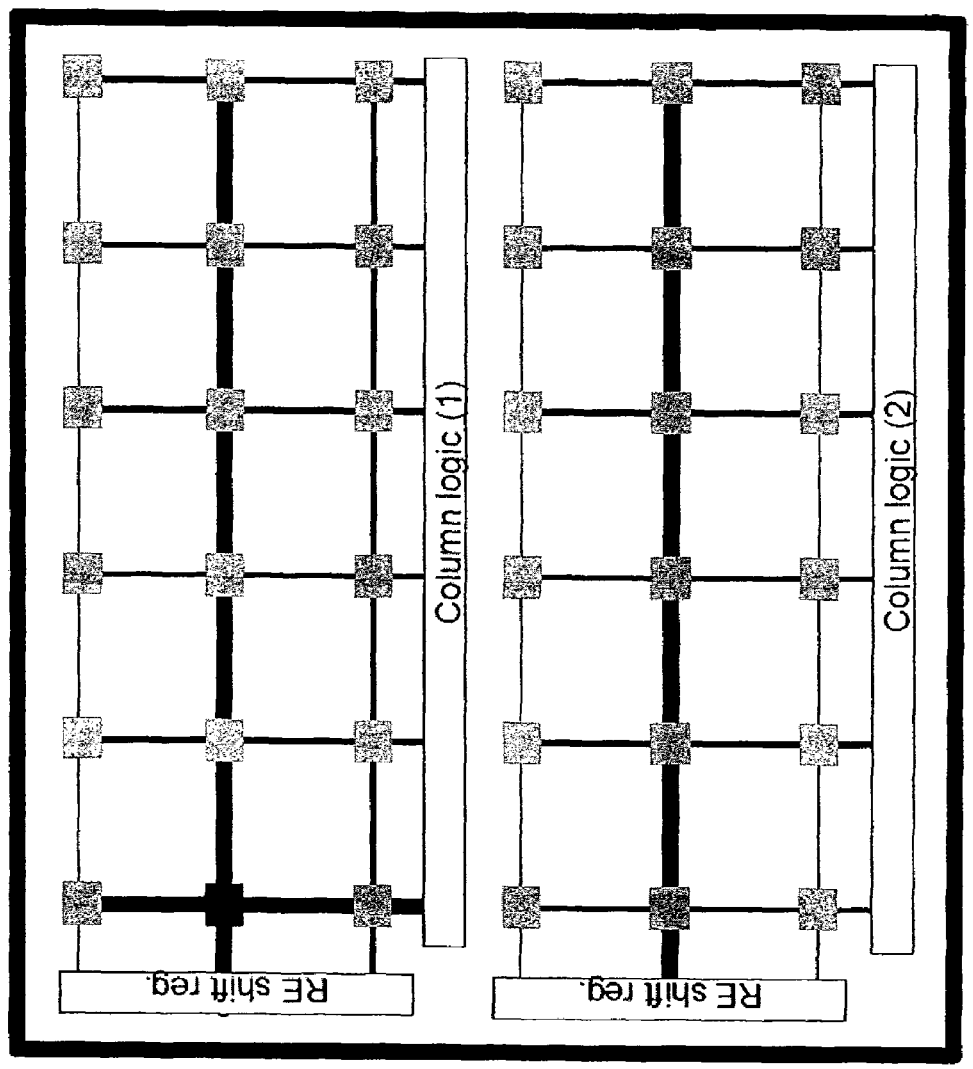

First, if the number of address pins are to be reduced, the original m×n grid may be vertically partitioned as shown in FIG. 8b. If a grid is partitioned as in FIG. 8b, the length of row enable shift register doubles, while the number of columns are halved and a column address is shared by two physical columns in the grid. In other words, the m×n grid is logically divided into two m×n/2 grids (such as the first grid being $m_1 \times n_1$ and the second grid being $m_2 \times n_2$). As shown in FIG. 8b, $m_1 = m_2$ and $n_1 = n_2$. Further, as shown in FIG. 8b, there are two sets of address decoding (with row enable shift register (1) and column logic; and row enable shift register (2) and column logic). In contrast, if the number of address pins are to be increased, the grid is partitioned horizontally as shown in FIG. 8c. In this case, the number of rows are halved and two physical rows are aliased and activated at the same time. The number of columns are effectively doubled by providing separate column addresses for each partition. In general, single m×n grid may be divided to k partitions of m×n/k virtually partitioned sub-grids or m/k×n horizontally partitioned sub-grids to form a PGRAS structure that utilize $\log_2 (n/k)$ or $\log_2 (kn)$ address pins, respectively. For both vertical and horizontal partitions, the routing overhead for the grids remains at a minimum as in the original single grid, while the transistor overhead increases. Table 5 shows the transistor overhead for different PGRAS configurations for benchmark circuits. Compared to the single grid in Table 2, the transistor overhead is increased. Although there is an increase in transistor overhead, this property of proposed grid partitioning is acceptable for the modern VLSI circuits because, in general, the routing complexity dominates the difficulty of circuit design, rather than the number of transistors.

TABLE 5

| | Transistor Overhead for PGRAS Partition Configuration | | | |
|---|---|---|---|---|
| Circuit name | 4m × n/4 (%) | 2m × n/2 (%) | m/2 × 2n (%) | m/4 × 4n (%) |
| s35932 | 9.5% | 8.2% | 9.1% | 11.7% |
| s38417 | 8.4% | 7.3% | 8.1% | 10.5% |
| s38584 | 7.8% | 6.7% | 7.5% | 9.7% |
| b17s | 5.3% | 4.6% | 5.1% | 6.7% |
| b20s | 6.8% | 5.6% | 7.1% | 9.7% |
| b22s | 5.7% | 4.8% | 5.7% | 7.7% |

As previously stated, the PRAS/PGRAS architecture may use the test responses captured in scan-cells as templates for the next test pattern. Thus, unlike serial scan, only those scan-cells may be updated which contain specified values and have conflicting values to the current state of circuit. The following analyzes the test application time depending on the configuration of the PGRAS grid. Further, a mathematical model is developed to estimate the test application time of the PGRAS architecture for any given circuit and test vector properties. Though the following focuses on the test application time, other benefits, such as reducing test power consumption and test data size by eliminating the scan-shift operation, are also present in PGRAS.

Using equation (2) above, one may analyze the test application time for PGRAS. The term $N \cdot (m+1)$ is total number of read cycles, and $n_w$ is total number of write cycles. Thus, for given N and $n_w$, the test application time may be dependant on m, which can be varied by the configuration of PGRAS. Assuming the number of scan-cells is power of two ($s=2^k$) and n' is negligible, equation (2) may be rewritten as follows by substituting m=s/n.

$$tex \approx \text{(need correct symbol)} N \cdot (s/n+1) + n_w = N \cdot (2^{k-a}+1) + n_w \quad (4)$$

Using test cost reduction methods described above, $n_w$ may be significantly reduced. Hence one may observe that the number of read cycle dominates $t_{ex}$. One may also observe from equation (4) that the total number of read cycles decreases exponentially by an addition of single address pin. This is in contrast to the MSS, in which the test application time decreases only inverse-proportionally to addition of test pins. Therefore, the PGRAS architecture may yield significant saving in test application time with the same number of test pins as MSS.

By developing an accurate mathematical method to estimate the test application time, the efficiency of employing the PGRAS architecture for any given circuit may be predicted, avoiding the complex process of obtaining the exact number of test cycles. Mathematical estimation of test application time may require estimation of $n_w$ from the equation (4), since N, m and n' are provided by the hardware configuration. As previously described, the PGRAS requires only write operations on the scan-cells that are specified and conflict with the current state. Thus, for a given fill-rate F, the number of write cycles $n_w$ may be expressed as:

$$n_w = p \cdot F \cdot N \cdot s \quad (5)$$

where p is the probability that a specified bit conflicts with current state. Assuming that current state and specified value are random, the p may equal to 0.5. However, using Test vector ordering and Hamming distance reduction methods discussed, p may be reduced. From the experiments on several benchmark circuits, p may drop to 0.38 on average with standard deviation of only 0.04 after applying the methods discussed above. The experimental results also show that there is no correlation between p and the circuit size, the fill-rate and the number of vectors used. By employing p=0.38 the estimated test application time is:

$$t_{es} = N \cdot (m+1) + 0.38 \cdot F \cdot N \cdot s + n' \qquad (6)$$

The accuracy of this model is verified again $t_{ex}$ in the following mathematical results.

The mathematical results are presented in three phases. First, the PGRAS method is evaluated based on the exact test application time analysis for various configurations of large ISCAS89 and ITC99 benchmark circuits. Second, the accuracy of test time estimation based on equation (6) is evaluated by comparing actual results and computed results. Finally, the verified test time estimation method is used to project the efficiency of the PGRAS method on an industrial circuit model.

In order to show the ability that the PGRAS may reduce the test application time even for the compacted vector set, only the highly compacted vectors are used. FIG. 9 summarizes the results. The number of scancells (s), the number of test vector (N), fill-rate of test vector (F), and the minimized number of scan-cell write operation ($n_w$) are given in the first row of each benchmark circuit block. Each benchmark circuit is first configured using a single m×n (close-to-square) grid as discussed above and presented in the fourth column. Then, four different PGRAS configurations are experimented by varying the number of test pins. For each grid configuration, $t_{ex}$ shows the exact number of test cycles. The row titled Speedup gives the speed up ratio of PGRAS when it is compared to multiple serial scan (MSS) that uses the same number or one more test pins—MSS requires a pair of test pins to increase the number of scan chains, thus one more pin is allowed when PGRAS uses odd number of test pins. For all benchmark circuits, the speed up ratio generally increases when the number of test pins are increased. This supports that the test application time of PGRAS decreases faster then that of MSS with addition of test pins as argued in the previous section. Particularly, the circuits with low F have a greater speed increase. Considering that tests for the industrial circuits usually have very low average fill-rate (e.g., under 1%), the PGRAS may do very well compared to MSS. This is verified below.

Finally, the last two rows, $Pin_{RAS}$ and $Pin_{MSS}$ in FIG. 9 compare the required number of test pins. $Pin_{RAS}$ lists actual number of test pins for a given PGRAS configuration, and the $Pin_{MSS}$ shows the number of pins required by MSS to achieve similar test application time. For example, the 8-pin PGRAS on s13207 has equivalent performance with 48-pin MSS. From the comparison of $Pin_{RAS}$ and $Pin_{MSS}$, one may observe that the PGRAS requires significantly fewer pins than MSS for all configurations for all benchmark circuits.

Figure 10:
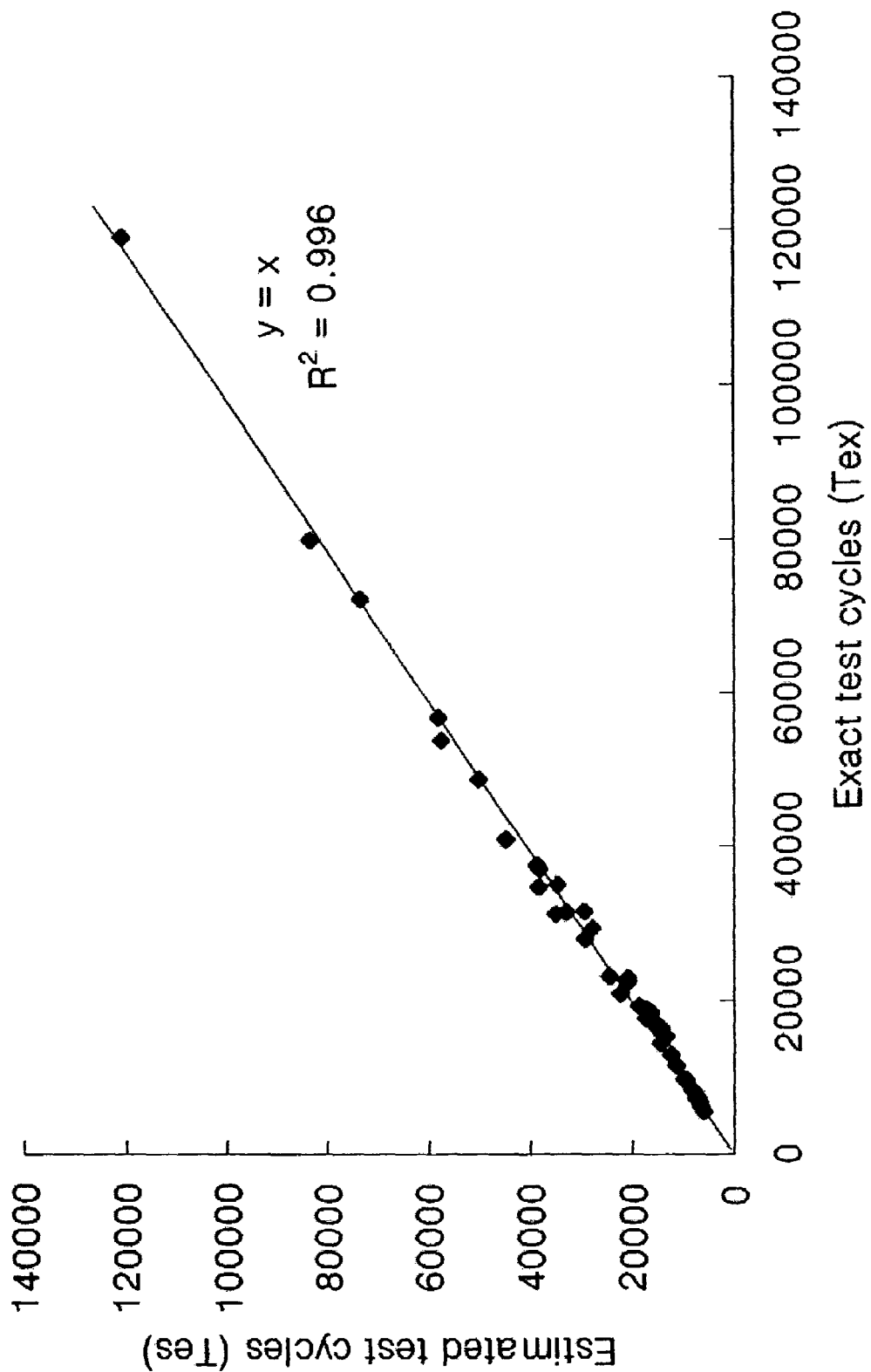
FIG. 10 is a graph where the x-axis is exact test cycles ($t_{ex}$) and the y-axis is test cycles ($t_{es}$) for the experiments illustrated in FIG. 9.

Before using the test application time estimation method on large industrial circuit models, its accuracy may be verified. The verification may be done by comparing exact test cycles ($t_{ex}$) with estimated test cycles ($t_{es}$) from equation (6) for all experiments in FIG. 9. FIG. 10 shows the result where x-axis is $t_{ex}$ and y-axis is $t_{es}$. Each point in the graph corresponds to an experimental case shown in FIG. 9. The line y=x represents the perfect match of $t_{ex}$ and $t_{es}$. As shown in FIG. 10, the $t_{es}$ for all cases matches very closely to the line with determination coefficient ($R^2$) of 0.996. Thus, one may conclude that the test application time estimation model is accurate.

The PGRAS may be applied to various sizes of circuits. For example, the above analysis is performed on large ISCAS89 and ITC99 circuits, the size of those circuits being significantly smaller than modern VLSI circuits. The performance of PGRAS may likewise be analyzed on a large circuit model. The industrial circuit model has 7 million gates and 330 thousand scan-cells. Test cube generated for this circuit has more than 14,400 vectors and the average fill-rate of test set is 0.2%. The base grid is chosen to be 648×510 with 10 test pins and the vertical/horizontal partition is done corresponding to the decreasing/increasing number of test pins. The estimated test application cycle is obtained from the verified mathematical model in equation (6).

Figure 11:
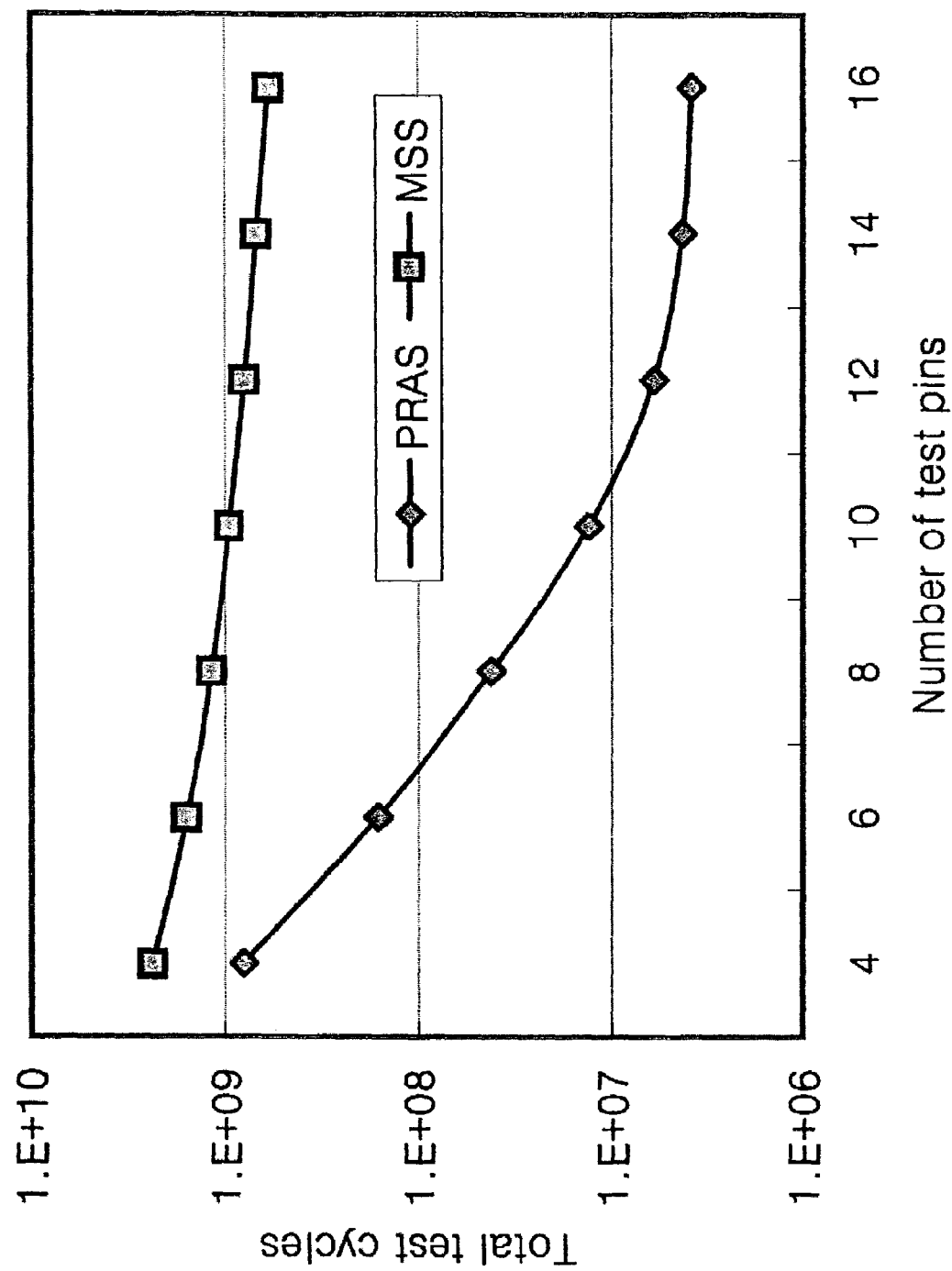
FIG. 11 is a graph that compares the test application time for the PGRAS and MSS.

FIG. 11 compares the test application time for the PGRAS and MSS. The total number of test cycles are given in logarithmic scale. As expected, the test application time for the PGRAS exponentially decreases by increasing the test pins while that of MSS decreases only as an inverse function of number of test pins.

Figure 12:
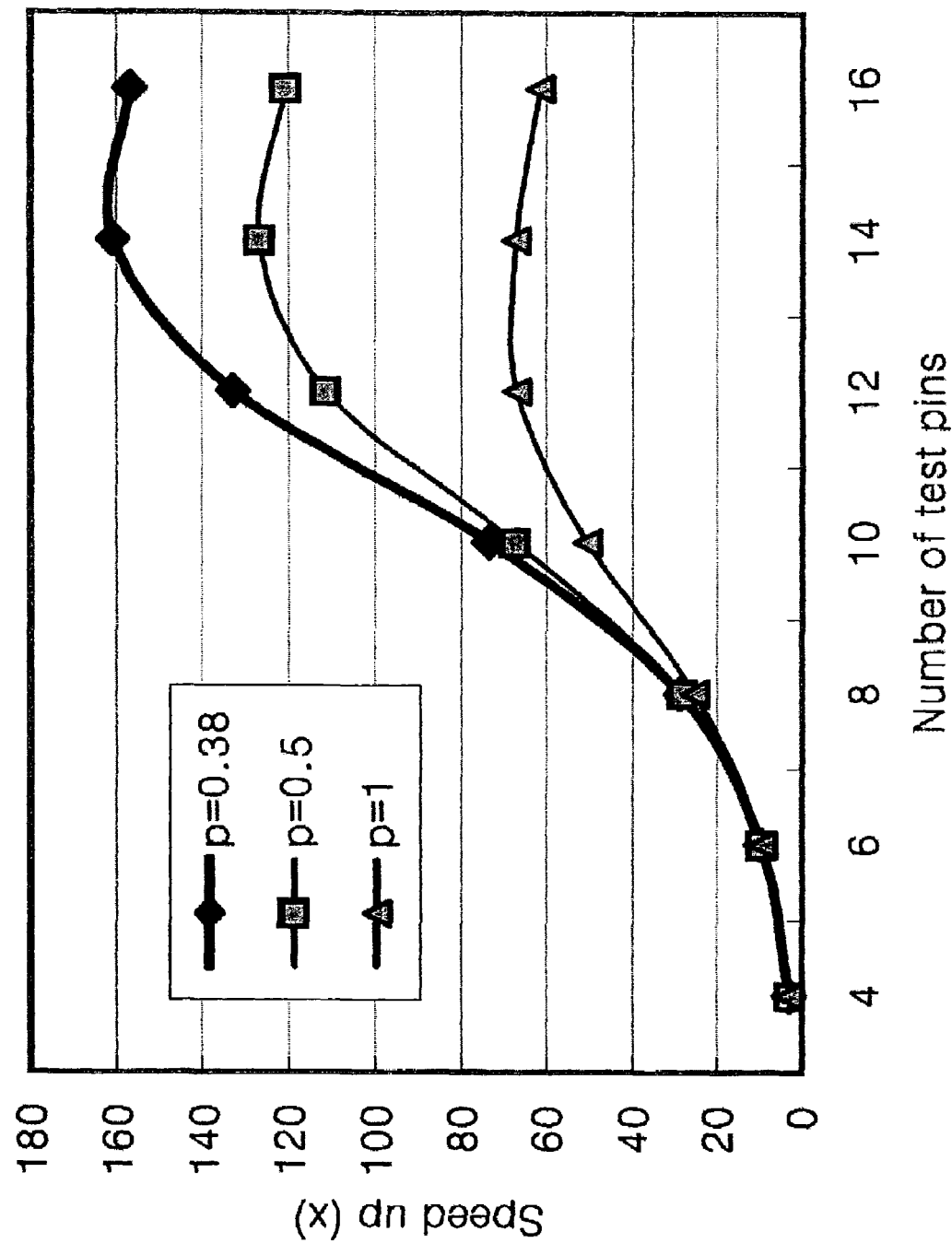
FIG. 12 is a graph that illustrates the speed up ratio of the PGRAS when its number of test cycles are compared to MSS.

FIG. 12 shows the speed up ratio of the PGRAS when its number of test cycles are compared to MSS. The bold line with p=0.38 represents the speed up ratio when $n_w$ minimization method discussed above is used. The speed up ratio increases with the addition of test pins. With single grid configuration (10 test pins), the PGRAS shows nearly 80 times speed up, and to achieve similar test application time with traditional MSS, 74 pins are required. If the grid is horizontally partitioned, the speed up ratio reaches more than 160 times with only 14 pins (16 horizontal partitions). To achieve similar test time of 14-pin PGRAS, the MSS requires 2274 pins.

Two other lines in the FIG. 12 show the speed up for p=0.5 and p=1. The line with 0.5 shows the speed up ratio without $n_w$ minimization methods, since the probability to update each specified bit is 50%. The line with p=1 shows the worst case when all specified bits have to be written. Note that even without $n_w$ minimization or in the worst case, the PGRAS offers significant speed up in test application time. Thus, as shown, PGRAS may achieve further reduction of test application time at the cost of increased transistor and test pin overhead. Assuming future decrease in per-transistor manufacturing cost, multiple PRAS structures may be more beneficial.

The PRAS and PGRAS architectures may be used for a variety of types of testing. For example, the architectures may be used for fault diagnosis testing. One type of fault diagnosis testing may be non-destructive, meaning that the circuit state may be read without destroying the current state. Therefore, reading the state of all or some of the scan-cells may be easily implemented by modifying the test application sequence shown in FIG. 5 to that shown in FIG. 13. This modification may be obtained by adding one step (either D1 or D2) to the original test application sequence shown in FIG. 5.

If step (D1) is inserted, the entire test response may be shifted out during the PRAS scan operation gathering a full snap-shot of the circuit state. In contrast, inserting step (D2) may provide a compressed signature for each test response with a reduced test application time. In any case, the non-destructive scan property of PRAS allows a snap-shot of circuit state to be taken and resumption of the test sequence from any point. In conventional serial-scan, this is not possible without adding shadow latches to every flip-flop to store a copy of the circuit state. This is because the states of the circuit are serially shifted out and often creates invalid state that can cause multiple drivers to drive a bus. This is known as bus contention. Once a non-destructive scan and snap-shot capability is available, the significant effort for fault diagnosis and silicon debug may be reduced.

Figure 14B:
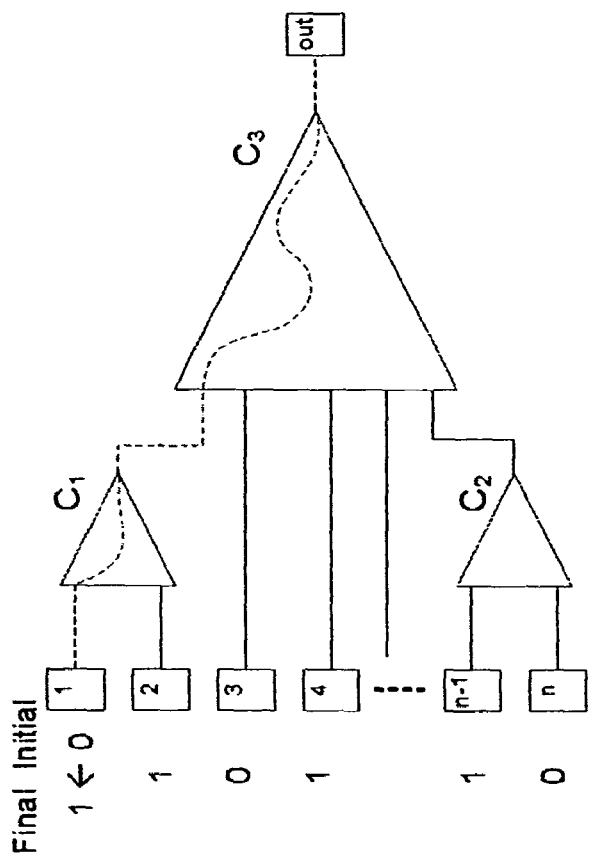
FIGS. 14a and 14b illustrate and compare two-pattern test under enhanced serial-scan and PRAS, respectively.
Figure 14A:
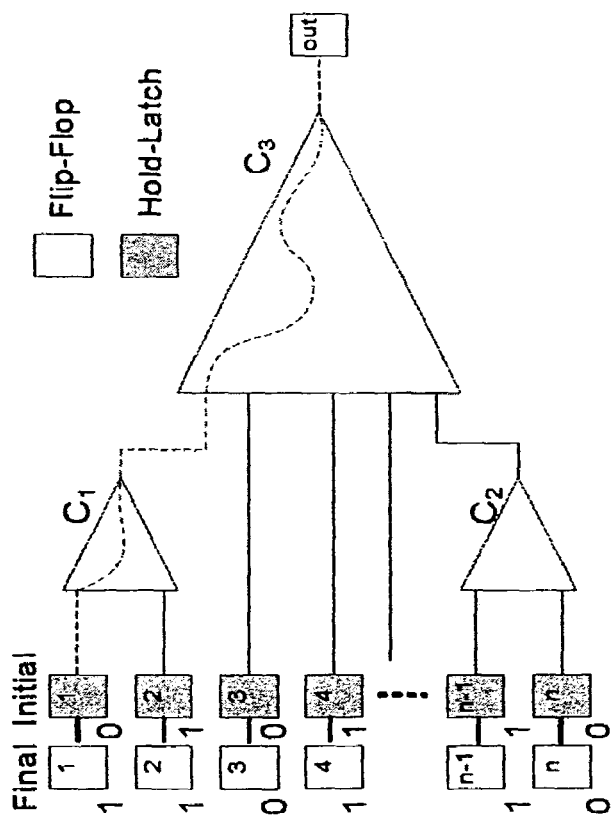

Another type of testing comprises performance or delay fault testing. Testing for path-delay faults is drawing significant attention from modern VLSI circuit designers. To test a delay fault in a specific path of a circuit, a two-pattern test composed of an initial state and a final state may be applied to launch a state transition. However, the limited state transition capability of serial-scan prevents application of two-pattern tests. In order to apply arbitrary two-pattern tests using serial-scan, a modified serial-scan called enhanced scan is used. The enhanced scan method uses an additional hold latch and a hold signal routed to each scan-cell in the circuit. Also, two-pattern tests using the enhanced scan method require a large number of test cycles since the entire two test patterns must be scanned into the scan-chain. The PRAS architecture, in contrast, provides an efficient two-pattern test architecture because of its individual accessability to each scan-cell. FIGS. 14a and 14b illustrate and compare two-pattern test under enhanced serial-scan and PRAS, respectively. In this example, a down transition on the path from $FF_1$ to $FF_{out}$ is to be tested. In order to load the initial pattern, RAS requires updates to only the subset of FFs whose inputs are different from the previous state. Enhanced scan requires loading the entire scan chain. The PRAS operation in this step is similar to the PRAS operation used for stuck-at fault testing. The ratio of reduction in test application time may be even higher than that for stuck-at fault testing since only one path is tested at a time and a large portion of the scan-cells would retain the previous states. Consider testing of the path $FF_2 \rightarrow FF_{out}$ after $FF_1 \rightarrow FF_{out}$. A large portion of the state can be reused to test the path $FF_2 \rightarrow FF_{out}$ since $FF_3$ to $FF_n$ are already set to propagate the transitions through the cone $C_3$.

This supports that the test application time to launch the final pattern may be reduced significantly. In enhanced serial-scan, the entire scan chain must be loaded with the final pattern, consuming n clock cycles whereas PRAS requires only one bit update to launch the final pattern.

Figure 15A:
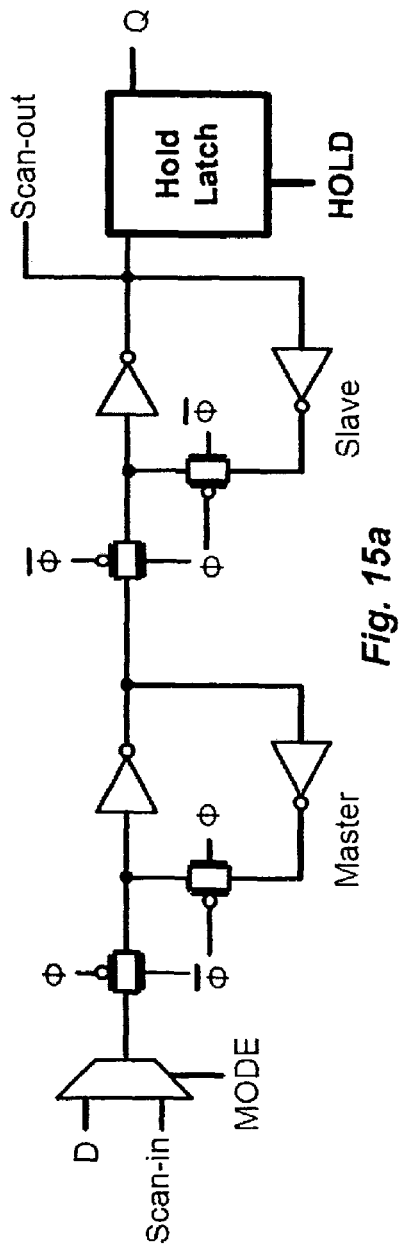
FIGS. 15a and 15b are block diagrams that compare the hardware modification for serial-scan and PRAS to enable two-pattern tests.
Figure 15B:
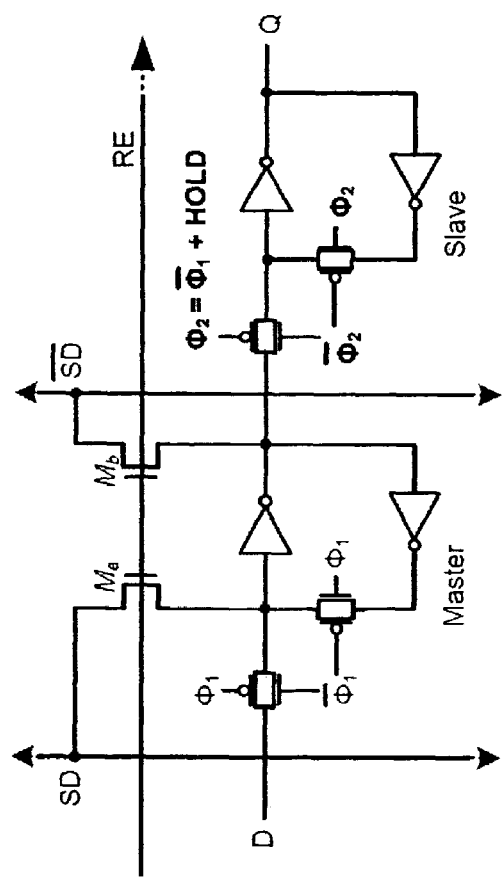

Another advantage of using PRAS for two-pattern tests is that the hardware overhead and performance overhead are significantly smaller than that of an enhanced scan-chain. FIGS. 15a and 15b compare the hardware modification for serial-scan and PRAS to enable two-pattern tests. For both enhanced scan and PRAS, the HOLD signal may be activated after scanning the initial pattern to hold its value while the final pattern is scanned. After the final pattern is scanned, simply lowering the HOLD signal will launch the transition.

As shown in FIG. 15a, enhanced serial-scan requires a hold latch, which is composed of at least 8 transistors, on the critical path of each scan-cell. Thus, a large performance and transistor overhead will be added. On the other hand, the PRAS-cell shown in FIG. 15b requires only a slight modification to the clock signal. The clock signal for the slave stage ($\Phi_2$) of the PRAS scan-cell may be OR-ed with the HOLD signal. Therefore, the slave latch in the PRAS scan-cell may act like a hold latch in the enhanced scan chain without any additional hardware on its critical path. Further, the slave latch in the serial-scan cell may not be used as a hold-latch because it must be included in the scan-path for both the initial and final pattern. The $\Phi_2$ of the PRAS scan-cell may be generated at each scan-cell with at most 4 transistors if a single clock is used. If a two-phase clock is used and $\Phi_2$ is controlled by HOLD at the source of clock no additional hardware will be required in the PRAS scan-cells.

Using the PRAS architecture enables practical and other benefits. First, the practicality of the PRAS architecture is discussed based upon the presented experimental results and the current/future issues in VLSI testing. Another benefit of the PRAS, increased diagnosability, is presented with industrial evidence which implies the importance of diagnosability and faster silicon debugging. Finally, the generalization of the proposed method is discussed and a possible extension of the proposed architecture is also suggested.

The experimental results discussed above show that the PRAS architecture significantly reduces the test application time, test data size and test power consumption that contribute largely to the test cost. Meanwhile, the hardware overhead of the PRAS architecture is marginally higher than traditional serial scan methods.

While the adherence to traditional serial-scan has its origin in keeping the hardware overhead low, there has been a shift in the cost factor. The SIA (Semiconductor Industry Association) roadmap alarmed that the cost of testing may soon exceed the cost of manufacturing. While the manufacturing cost per transistor is decreasing exponentially, the test cost per transistor may gradually increase. Therefore, solving test problems at the price of the slightly more hardware utilized in the PRAS architecture would be a less expensive route to reduce overall cost of manufacturing current and future VLSI circuits.

Besides the test cost reduction, the PRAS architecture has another advantage over conventional serial-scan method. The response collection method used in the PRAS architecture is non-destructive, meaning that the circuit states may be read without destroying the current states. Such operation may be easily implemented by reading MISR signature after application of each test vector. This non-destructive scan property of the PRAS architecture allows snap-shot of circuit states and resumption of the test sequence at any point. In conventional serial-scan, this is not possible without adding shadow latches to store a copy of circuit states for every flip-flops, because the states of circuit are serially shifted out.

Once the non-destructive scan and snap-shot capability is provided, the significant effort for fault diagnosis and silicon debug may be reduced. In recognition of this fact, Intel® employed the shadow latches (Full-Hold-Scan System) on their Pentium® processor. The cost/benefit analysis in claims that the improved diagnosability brought significant benefits on overall manufacturing cost, regardless of the hardware and performance overhead. The PRAS architecture, however, does not require additional hardware to provide non-destructive scan capability, since simple modification to the test application sequence in FIG. 5 and the MISR may provide the snap-shot capability.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A scan cell for testing an integrated circuit, the scan cell operating in a test mode and a non-test mode, the scan cell comprising:
   circuitry configured to receive an input signal indicative of being in a test mode or a non-test mode,
   wherein the circuitry is configured to activate a storage element in order to operate in the non-test mode as a storage element when the input signal is indicative of the non-test mode, and
   wherein the circuitry is configured to activate a feedback group of at least two inverters accessed by one or more data lines, and one or more pass transistors in order to operate as a static random access memory (SRAM) cell in the test mode when the input signal is indicative of the test mode.

2. The scan cell of claim 1, wherein the circuitry comprises a storage element and at least one pass transistor.

3. The scan cell of claim 2, wherein the circuitry consists of the storage element and one or more pass transistors.

4. The scan cell of claim 3, wherein the storage element comprises a flip flop.

5. The scan cell of claim 3, wherein the scan cell is addressable.

6. The scan cell of claim 5, wherein the one or more pass transistors are controlled by at least one address line for addressing the scan cell.

7. The scan cell of claim 6, wherein the at least one address line comprises a first address line and a second address line; and
wherein the first address line is connected to a gate of the one or more pass transistors; and
wherein the second address line is in communication with one of a source or drain of the one or more pass transistors.

8. The scan cell of claim 7, wherein the first address line comprises a row enable line and the second address line comprises a column enable line.

9. The scan cell of claim 7, wherein a data line is connected to an input of driver circuitry controlled by the second address line, an output of the driver being connected to the source or drain of the one or more pass transistors.

10. A scan cell for testing an integrated circuit, the scan cell operating in a test mode and a non-test mode, the scan cell comprising:
a storage element having an input and an output;
clock circuitry in communication with the storage element; and
two or fewer pass transistors, at least a part of each of the pass transistors electrically connected with at least a part of the storage element, the pass transistors being used to individually address the scan cell during the test mode.

11. The scan cell of claim 10, wherein the storage element comprises a flip flop with a master stage and a slave stage; and
wherein each of the two pass transistors are electrically connected to the master stage of the flip flop.

12. The scan cell of claim 10, wherein a critical path is defined by signal flow through the scan cell in a non-test mode; and
wherein the two pass transistors are in a path outside of the critical path.

13. A scan cell for testing an integrated circuit, the scan cell operating in a test mode and a non-test mode, the scan cell comprising:
a storage element having an input and an output;
one or more pass transistors, at least a part of each of the pass transistors electrically connected with at least a part of the storage element, the pass transistors being used to individually address the scan cell during the test mode; and
at least one input line for the scan cell, the at least one input line being used to input data to the storage element in the scan cell and being used to address the scan cell.

14. The scan cell of claim 13, wherein at least one of the address lines is electrically connected to the one or more pass transistors to turn the one or more pass transistors on and off.

15. The scan cell of claim 14, wherein at least one driver is in communication with the scan cell, the driver comprising an input line, an output line, and a control line;
wherein another of the address lines comprises the control line for the driver;
wherein an input data line comprises the input line for the driver; and
wherein the output line of the driver comprises the at least one input line for the scan cell.

16. The scan cell of claim 15, wherein the output line for the driver is electrically connected to one of a source or drain of the pass transistor; and
wherein another of the source or drain of the pass transistor is electrically connected to the storage element.

17. A scan cell for testing an integrated circuit, the scan cell operating in a test mode and a non-test mode, the scan cell comprising:
a storage element having at least a first stage and a second stage, the first stage operating on a first clock cycle ($\Phi_1$) and the second stage operating on a second clock cycle ($\Phi_2$), with $\Phi_1$ not equal to $\Phi_2$; and
circuitry in communication with at least one stage of the storage element for individually addressing the scan cell during the test mode, the circuitry comprising an input line used to input data to the storage element in the scan cell and used to address the scan cell.

18. The scan cell of claim 17, wherein the storage element comprises a flip flop with a master stage and a slave stage;
wherein the first stage comprises the master stage; and
wherein the second stage comprises the slave stage.

19. The scan cell of claim 18, wherein $\Phi_2=\Phi_1+\text{HOLD}$, and wherein HOLD comprises a time period to test the performance of the integrated circuit.

* * * * *